United States Patent
Weng et al.

(10) Patent No.: US 11,614,592 B2
(45) Date of Patent: Mar. 28, 2023

(54) SEMICONDUCTOR DEVICES AND METHODS OF MANUFACTURE

(71) Applicant: Taiwan Semiconductor Manufacturing Co., Ltd., Hsinchu (TW)

(72) Inventors: Chung-Ming Weng, Hsinchu (TW); Chen-Hua Yu, Hsinchu (TW); Chung-Shi Liu, Hsinchu (TW); Hao-Yi Tsai, Hsinchu (TW); Cheng-Chieh Hsieh, Tainan (TW); Hung-Yi Kuo, Taipei (TW); Chih-Hsuan Tai, Taipei (TW); Hua-Kuei Lin, Hsinchu (TW); Tsung-Yuan Yu, Taipei (TW); Min-Hsiang Hsu, Hsinchu (TW)

(73) Assignee: TAIWAN SEMICONDUCTOR MANUFACTURING CO., LTD., Hsinchu (TW)

( * ) Notice: Subject to any disclaimer, the term of this patent is extended or adjusted under 35 U.S.C. 154(b) by 172 days.

(21) Appl. No.: 16/930,702

(22) Filed: Jul. 16, 2020

(65) Prior Publication Data

US 2021/0223489 A1 Jul. 22, 2021

Related U.S. Application Data

(60) Provisional application No. 62/964,375, filed on Jan. 22, 2020.

(51) Int. Cl.
*G02B 6/42* (2006.01)
*H01L 25/16* (2023.01)
(Continued)

(52) U.S. Cl.
CPC ......... *G02B 6/4253* (2013.01); *G02B 6/4206* (2013.01); *H01L 21/4853* (2013.01); *H01L 21/563* (2013.01); *H01L 23/3185* (2013.01); *H01L 24/16* (2013.01); *H01L 25/167* (2013.01); *H01L 2224/16227* (2013.01); *H01L 2924/18161* (2013.01)

(58) Field of Classification Search
CPC .. G02B 6/4253; G02B 6/4206; G02B 6/4214; G02B 6/10; H01L 21/4853;
(Continued)

(56) References Cited

U.S. PATENT DOCUMENTS 6,670,222 B1 * 12/2003 Brodsky ............... H01L 24/32
438/118
8,855,452 B2   10/2014 Andry et al.
(Continued)

FOREIGN PATENT DOCUMENTS

CN    103217740 A    7/2013
CN    109799577 A    5/2019
(Continued)

*Primary Examiner* — Ellen E Kim
(74) *Attorney, Agent, or Firm* — Slater Matsil, LLP

(57) ABSTRACT

Photonic devices and methods of manufacture are provided. In embodiments a fill material and/or a secondary waveguide are utilized in order to protect other internal structures such as grating couplers from the rigors of subsequent processing steps. Through the use of these structures at the appropriate times during the manufacturing process, damage and debris that would otherwise interfere with the manufacturing process of the device or operation of the device can be avoided.

20 Claims, 25 Drawing Sheets

(51) Int. Cl.
*H01L 23/00* (2006.01)
*H01L 23/31* (2006.01)
*H01L 21/56* (2006.01)
*H01L 21/48* (2006.01)

(58) Field of Classification Search
CPC ... H01L 21/563; H01L 23/3185; H01L 24/16; H01L 25/167; H01L 2224/16227; H01L 2924/18161; H01L 23/49816; H01L 21/6835; H01L 23/3128; H01L 21/561; H01L 21/568; H01L 21/6836; H01L 23/5389; H01L 2221/68331; H01L 2221/68345; H01L 2221/68372; H01L 2224/16225; H01L 2224/18; H01L 2224/32225; H01L 2224/73204; H01L 2224/92125; H01L 2924/15311; H01L 23/50; H01L 23/293; H01L 23/31; H01L 23/481; H01L 23/525; H01L 25/04; H01L 2223/6627; H01L 2924/1903

See application file for complete search history.

(56) References Cited

U.S. PATENT DOCUMENTS

| 10,585,254 | B2 | 3/2020 | Carothers et al. |
| 10,746,923 | B2 | 8/2020 | Yu et al. |
| 10,930,628 | B2 | 2/2021 | Chang et al. |
| 2016/0111852 | A1* | 4/2016 | Arimoto ............... G02B 6/4206 372/50.11 |
| 2017/0316954 | A1* | 11/2017 | Lu ........................ H01L 25/16 |
| 2018/0052281 | A1* | 2/2018 | Kuo ..................... G02B 6/1221 |
| 2018/0052290 | A1 | 2/2018 | Kinghorn et al. |
| 2018/0136391 | A1* | 5/2018 | Inada ..................... G02B 6/136 |
| 2018/0314003 | A1 | 11/2018 | Coolbaugh et al. |
| 2019/0004247 | A1 | 1/2019 | Huang et al. |
| 2019/0057933 | A1* | 2/2019 | Lin ........................ H01L 25/105 |
| 2019/0148301 | A1* | 5/2019 | Huang ............... H01L 23/49838 257/774 |
| 2019/0162901 | A1* | 5/2019 | Yu ........................ H01L 23/147 |
| 2019/0243064 | A1* | 8/2019 | Menezo .................. G02B 6/136 |
| 2019/0250326 | A1* | 8/2019 | May ..................... G02B 6/122 |
| 2019/0293867 | A1* | 9/2019 | Liu ....................... G02B 5/1819 |
| 2019/0295943 | A1* | 9/2019 | Tan ................... H01L 21/76816 |
| 2019/0372676 | A1* | 12/2019 | Iida ...................... H04B 10/80 |
| 2020/0006088 | A1 | 1/2020 | Yu et al. |
| 2021/0333491 | A1 | 10/2021 | Menezo |

FOREIGN PATENT DOCUMENTS

| CN | 110637246 | A | 12/2019 |
| CN | 110646898 | A | 1/2020 |
| CN | 110648974 | A | 1/2020 |
| KR | 20190003296 | A | 1/2019 |
| WO | 2019050477 | A1 | 3/2019 |

* cited by examiner

SEMICONDUCTOR DEVICES AND METHODS OF MANUFACTURE

PRIORITY CLAIM AND CROSS-REFERENCE

This application claims the benefit of U.S. Provisional Application No. 62/964,375, filed on Jan. 22, 2020, which application is hereby incorporated herein by reference.

BACKGROUND

Electrical signaling and processing have been the mainstream techniques for signal transmission and processing. Optical signaling and processing have been used in increasingly more applications in recent years, particularly due to the use of optical fiber-related applications for signal transmission.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figure 1A:
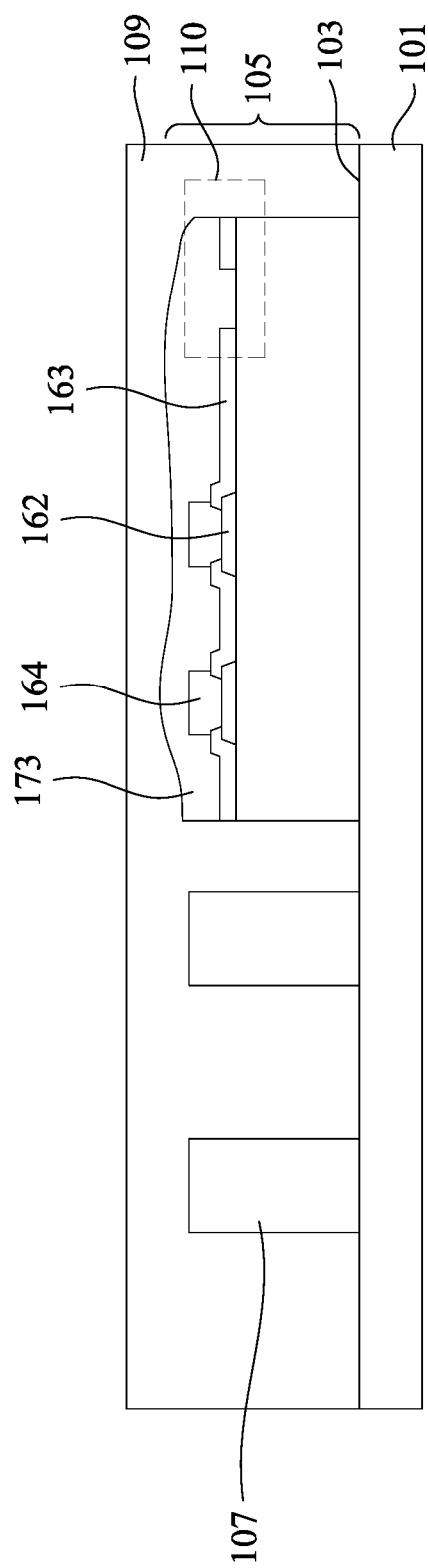
FIGS. 1A-1B illustrates placement of a first photonic integrated circuit, in accordance with some embodiments.

The following disclosure provides many different embodiments, or examples, for implementing different features of the invention. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

Embodiments will now be described with respect to specific methods and processes which work to protect sensitive components of photonic integrated circuits such as grating couplers and waveguides. However, the embodiments discussed herein are intended to be representative and are not meant to limit the embodiments in any fashion.

Figure 1B:
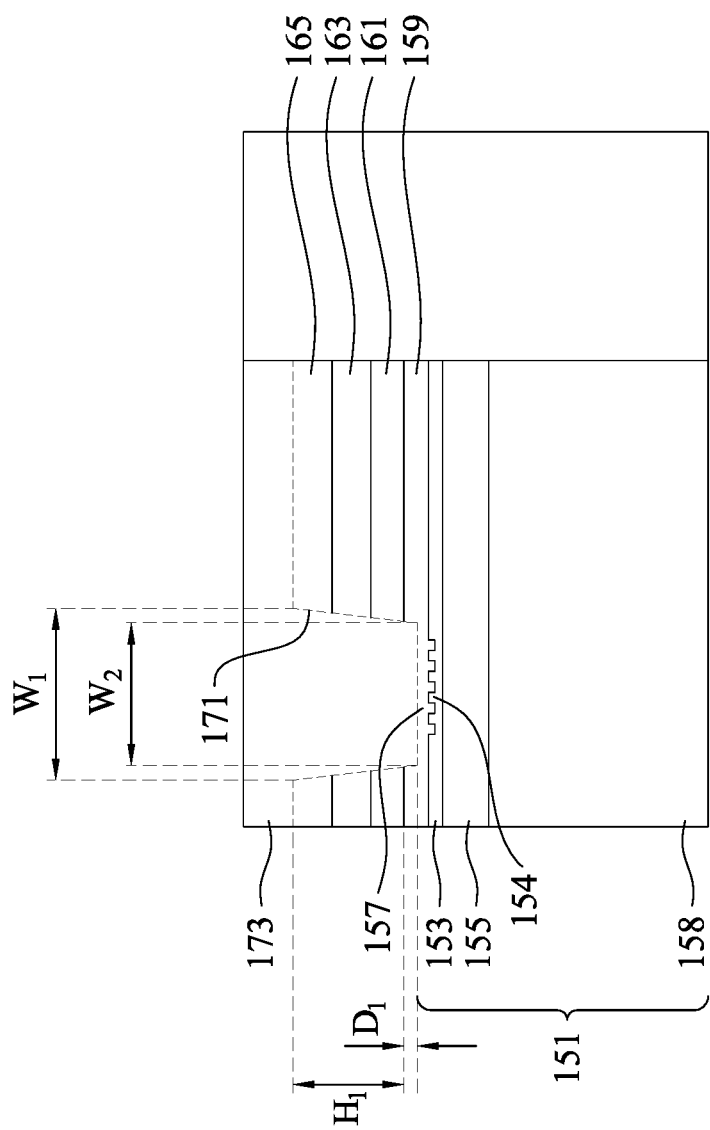

With reference now to FIGS. 1A-1B, with FIG. 1B being a close-up view of the dashed box labeled 110 in FIG. 1A, there is illustrated a method of forming a pluggable modularized device which comprises a first carrier substrate 101, an first adhesive layer 103 over the first carrier substrate 101, and the formation of through insulator vias (TIVs) 107 over the first adhesive layer 103. The first carrier substrate 101 comprises, for example, silicon based materials, such as glass or silicon oxide, or other materials, such as aluminum oxide, combinations of any of these materials, or the like. The first carrier substrate 101 is planar in order to accommodate an attachment of semiconductor devices such as a first photonic integrated circuit 105 (described further below).

The first adhesive layer 103 is placed on the first carrier substrate 101 in order to assist in the adherence of overlying structures (e.g., the first photonic integrated circuit 105). In an embodiment the first adhesive layer 103 may comprise a die attach film, an ultra-violet glue, which loses its adhesive properties when exposed to ultra-violet light. However, other types of adhesives, such as pressure sensitive adhesives, radiation curable adhesives, epoxies, combinations of these, or the like, may also be used. The first adhesive layer 103 may be placed onto the first carrier substrate 101 in a semi-liquid or gel form, which is readily deformable under pressure.

The TIVs 107 are formed over the first adhesive layer 103, and comprise a first seed layer (not shown separately from the TIVs 107). The first seed layer is formed over the first adhesive layer 103, and is a thin layer of a conductive material that aids in the formation of a thicker layer during subsequent processing steps. The first seed layer may comprise a layer of titanium about 1,000 Å thick followed by a layer of copper about 5,000 Å thick. The first seed layer may be created using processes such as sputtering, evaporation, or PECVD processes, depending upon the desired materials. The first seed layer may be formed to have a thickness of between about 0.3 µm and about 1 µm, such as about 0.5 µm.

Once the first seed layer has been formed, a photoresist (not separately illustrated) is placed and patterned over the first seed layer. In an embodiment the photoresist may be placed on the first seed layer using, e.g., a spin coating technique to a height of between about 50 µm and about 250 µm, such as about 120 µm. Once in place, the photoresist may then be patterned by exposing the photoresist to a patterned energy source (e.g., a patterned light source) so as to induce a chemical reaction, thereby inducing a physical change in those portions of the photoresist exposed to the patterned light source. A developer is then applied to the exposed photoresist to take advantage of the physical changes and selectively remove either the exposed portion of the photoresist or the unexposed portion of the photoresist, depending upon the desired pattern.

In an embodiment the pattern formed into the photoresist is a pattern for the TIVs 107. The TIVs 107 are formed in such a placement as to allow electrical paths to be located adjacent to the subsequently placed first photonic integrated circuit 105 and may be formed with a pitch of less than about 40 µm. However, any suitable arrangement for the pattern of TIVs 107, such as by being located such that one or more first photonic integrated circuits 105 are placed on opposing sides of the TIVs 107, may be utilized.

In an embodiment the TIVs 107 are formed within the photoresist and comprise one or more conductive materials, such as copper, tungsten, other conductive metals, or the like. The TIVs 107 may be formed, for example, by electroplating, electroless plating, or the like. In an embodiment, an electroplating process is used wherein the first seed layer and the photoresist are submerged or immersed in an electroplating solution. The first seed layer surface is electrically connected to the negative side of an external DC power supply such that the first seed layer functions as the cathode in the electroplating process. A solid conductive anode, such as a copper anode, is also immersed in the solution and is attached to the positive side of the power supply. The atoms from the anode are dissolved into the solution, from which the cathode, e.g., the first seed layer, acquires the dissolved atoms, thereby plating the exposed conductive areas of the first seed layer within the opening of the photoresist.

Once the TIVs 107 have been formed using the photoresist and the first seed layer, the photoresist may be removed using a suitable removal process. In an embodiment, a plasma ashing process may be used to remove the photoresist, whereby the temperature of the photoresist may be increased until the photoresist experiences a thermal decomposition and may be removed. However, any other suitable process, such as a wet strip, may be utilized. The removal of the photoresist may expose the underlying portions of the first seed layer.

Once exposed a removal of the exposed portions of the first seed layer may be performed. In an embodiment the exposed portions of the first seed layer (e.g., those portions that are not covered by the TIVs 107) may be removed by, for example, a wet or dry etching process. For example, in a dry etching process reactants may be directed towards the first seed layer using the TIVs 107 as masks. In another embodiment, etchants may be sprayed or otherwise put into contact with the first seed layer in order to remove the exposed portions of the first seed layer. After the exposed portion of the first seed layer has been etched away, a portion of the first adhesive layer 103 is exposed between the TIVs 107.

FIG. 1A additionally illustrates a placement of the first photonic integrated circuit 105 onto the first adhesive layer 103. The first photonic integrated circuit 105 is utilized to transmit and receive optical signals. In particular, the first photonic integrated circuit 105 converts electrical signals to optical signals for transmission along an optical fiber 901 (not illustrated in FIGS. 1A-1B, but illustrated and described further below with respect to FIG. 9), and convert optical signals from the optical fiber 901 to electrical signals. Accordingly, the first photonic integrated circuit 105 is responsible for the input/output (I/O) of optical signals to/from the optical fiber 901.

FIG. 1B illustrates a close up view of the dashed box 110 in FIG. 1A and shows a close up, more detailed view of the first photonic integrated circuit 105. In an embodiment the first photonic integrated circuit 105 may be formed using a silicon-on-insulator (SoI) substrate 151. Generally, an SOI substrate comprises a layer of a semiconductor material 153, such as silicon, formed on an insulator layer 155. The insulator layer 155 may be, for example, a buried oxide (BOX) layer or a silicon oxide layer. The insulator layer 155 is provided on a substrate 158, typically a silicon or glass substrate. Other substrates, such as a multi-layered or gradient substrate may also be used.

FIG. 1B additionally illustrates formation of a grating coupler 157 over waveguides 154 formed within the semiconductor material 153. In an embodiment the waveguides 154 may be silicon waveguides formed by patterning the semiconductor material 153. Patterning the semiconductor material 153 may be accomplished with acceptable photolithography and etching techniques. For example, a photoresist may be formed and developed on the front side of the semiconductor material 153. The photoresist may be patterned with openings corresponding to the waveguides 154. One or more etching processes may be performed using the patterned photoresist as an etching mask. In particular, the front side of the semiconductor material 153 may be etched to form recesses defining the waveguides 154; the remaining unrecessed portions of the semiconductor material 153 form the waveguides 154, with sidewalls of the remaining unrecessed portions defining sidewalls of the waveguides 154. The etching processes may be an anisotropic wet or dry etch. It should be appreciated that the dimensions of the waveguides 154 depends on the application; in an embodiment, the waveguides 154 have a width of from about 500 nm to about 3000 nm, such as about 500 nm, and a height of from about 220 nm to about 300 nm, such as about 250 nm.

The waveguides 154 further comprise the grating couplers 157, which are formed in top portions of the waveguides 154. The grating couplers 157 allow the waveguides 154 to transmit light to or receive light from an overlying light source or optical signal source (e.g., the optical fiber 901). The grating couplers 157 may be formed by acceptable photolithography and etching techniques. In an embodiment, the grating couplers 157 are formed after the waveguides 154 are defined. For example, a photoresist may be formed and developed on the front side of the semiconductor material 153 (e.g., on the waveguides 154 and in the recesses defining them). The photoresist may be patterned with openings corresponding to the grating couplers 157, and one or more etching processes may be performed using the patterned photoresist as an etching mask. In particular, the front side of the semiconductor material 153 may be etched to form recesses in the waveguides 154 defining the grating couplers 157. The etching processes may be an anisotropic wet or dry etch.

Once the waveguides 154 and the grating coupler 157 have been formed, a dielectric layer 159 is formed on the front side of the semiconductor material 153. The dielectric layer 159 is formed over the waveguides 154 and the grating coupler 157, and in the recesses defining the waveguides 154 and grating couplers 157. The dielectric layer 159 may be formed of silicon oxide, silicon nitride, a combination thereof, or the like, and may be formed by CVD, PVD, atomic layer deposition (ALD), a spin-on-dielectric process, the like, or a combination thereof. After formation, the dielectric layer 159 may be planarized, such as by a chemical mechanical polish (CMP) or a mechanical grinding, to avoid transfer of the pattern of the waveguides 154 to the dielectric layer 159. In an embodiment, the dielectric layer 159 is an oxide of the material of the semiconductor material 153, such as silicon oxide. Due to the difference in refractive indices of the materials of the waveguides 154 and dielectric layer 159, the waveguides 154 have high internal reflections such that light is confined in the waveguides 154, depending on the wavelength of the light and the reflective indices of the respective materials. In an embodiment, the refractive index of the material of the waveguides 154 is higher than the refractive index of the material of the dielectric layer 159.

FIG. 1B additionally illustrates a formation of a redistribution structure 161, such as a back end of line (BEOL) structure over the semiconductor material 153 and the dielectric layer 159 in order to make electrical connections to the structures within the first photonic integrated circuit 105. In an embodiment the redistribution structure 161 may be formed of one or more layers of conductive materials separated by one or more layers of dielectric materials. In some embodiments, the dielectric material is deposited and then patterned in order to form openings, and then those openings are filled and/or overfilled with a conductive material. The conductive material is then planarized in order to embed the conductive material into the dielectric material in either a damascene or dual damascene process. Once a first level has been formed, additional levels may be formed by repeating the damascene or dual damascene processes.

Once the redistribution structure 161 has been formed, contact pads 162 (see FIG. 1A) may be formed over the redistribution structure 161 in order to provide electrical connectivity between the redistribution structure 161 and overlying structures. In an embodiment the contact pads 162 are formed of a conductive material such as aluminum, although other suitable materials, such as copper, tungsten, or the like, may alternatively be utilized. The contact pads 162 may be formed using a process such as CVD, although other suitable materials and methods may alternatively be utilized. Once the material for the contact pads 162 has been deposited, the material may be shaped into the contact pads 162 using, e.g., a photolithographic masking and etching process.

A passivation film 163 is formed on the back side of the redistribution structure 161. The passivation film 163 may be formed from one or more dielectric materials, such as silicon oxide, silicon nitride, the like, or combinations thereof, using a deposition process such as chemical vapor deposition, physical vapor deposition, atomic layer deposition, combinations of these, or the like. In a particular embodiment the passivation film 163 may be a tri-layer film which comprises two layers of dielectric materials which sandwich a layer of a conductive material, such as a a metal like aluminum. However, any suitable material and method of manufacture may be utilized.

Once the passivation film 163 has been formed, a protection layer 165 may be formed over the passivation film 163. In an embodiment the protection layer 165 may be a polymer based dielectric material such as polyimide, although any suitable material, such as polybenzoxazole (PBO) or a polyimide derivative, may be utilized. The protection layer 165 may be placed using, e.g., a spin-coating process. However, any suitable material and method of deposition may be used.

After the protection layer 165 has been formed, external contacts 164 (see FIG. 1A) may be formed to provide external connection to the first photonic integrated circuit 105. In an embodiment the external contacts 164 may be conductive pillars such as copper pillars and may be formed by initially patterning the protection layer 165 and the passivation film 163 to expose portions of the underlying contact pads 162 using, e.g., a photolithographic masking with a photoresist and etching process. Once the contact pads 162 have been exposed, conductive material may be plated into the openings through the photoresist and the protection layer 165, and the photoresist may be removed. The external contacts 164 may be formed with a pitch of greater than about 25 μm. However, any suitable materials, methods, and pitches may be utilized.

After the external contacts 164 have been formed, the protection layer 165, the passivation film 163, the redistribution structure 161, and a portion of the dielectric layer 159 are patterned to form an opening 171 in order to allow the transmission of light through these layers and to the grating coupler 157. In an embodiment the opening 171 may be formed using a photolithographic masking and etching process whereby a photoresist is placed over the protection layer 165, exposed, and developed in order to expose the portion of the protection layer 165 that is desired to be removed. Then, one or more anisotropic etching processes are utilized to sequentially etch through the remaining layers.

In an embodiment the opening 171 is sized in order to allow for the passage of optical signals to and from the optical fiber 901. In an embodiment the opening 171 may have a first width $W_1$ at a top of the opening 171 of between about 30 μm and about 40 μm, and may have a second width $W_2$ at a bottom of the opening 171 of between about 20 μm and about 30 μm. Additionally, the opening 171 may have a first height Hi no greater than about 13.5 μm, and may extend into the first dielectric layer 159 a first depth $D_1$ of less than about 310 nm. However, any suitable dimensions may be utilized.

Once the opening 171 has been formed, the opening 171 may be filled using a fill material 173. In an embodiment the fill material 173 may be a material which is translucent to the passage of light but still protects the underlying structures such as the grating coupler 157 and the waveguides 154. In particular embodiments the fill material 173 may be a material such as polyimide, epoxy, siloxane, combinations of these, or the like. The fill material 173 may be applied or deposited using a deposition process such as spin-on, chemical vapor deposition, physical vapor deposition, atomic layer deposition, or the like. The fill material 173 may be applied or deposited to fill and overfill the opening 171 and may be deposited to a second depth over the protection layer 165 of between about 13 µm and about 31 µm. However, any suitable materials, methods of formation, and thicknesses may be utilized.

Once the first photonic integrated circuit 105 has been manufactured, the first photonic integrated circuit 105 may be singulated in preparation for placement. In an embodiment the singulation may be performed by using a saw blade (not separately illustrated) to slice through the insulator SoI substrate 151 and overlying structures. However, as one of ordinary skill in the art will recognize, utilizing a saw blade for the singulation is merely one illustrative embodiment and is not intended to be limiting. Any method for performing the singulation, such as utilizing one or more etches, may be utilized. These methods and any other suitable methods may be utilized to singulate the structure.

Once singulated, the first photonic integrated circuit 105 is placed on the first carrier substrate 101. In an embodiment the first photonic integrated circuit 105 may be placed onto the first adhesive layer 103 using, e.g., a pick and place process. However, any other method of placing the first photonic integrated circuit 105 may be used.

Returning now to FIG. 1A, FIG. 1A also illustrates an encapsulation of the TIVs 107 and the first photonic integrated circuit 105. The encapsulation may be performed in a molding device (not individually illustrated in FIG. 1A), which may comprise a top molding portion and a bottom molding portion separable from the top molding portion. When the top molding portion is lowered to be adjacent to the bottom molding portion, a molding cavity may be formed for the first carrier substrate 101, the TIVs 107, and the first photonic integrated circuit 105.

During the encapsulation process the top molding portion may be placed adjacent to the bottom molding portion, thereby enclosing the first carrier substrate 101, the TIVs 107, and the first photonic integrated circuit 105 within the molding cavity. Once enclosed, the top molding portion and the bottom molding portion may form an airtight seal in order to control the influx and outflux of gasses from the molding cavity. Once sealed, an encapsulant 109 may be placed within the molding cavity. The encapsulant 109 may be a molding compound resin such as polyimide, PPS, PEEK, PES, a heat resistant crystal resin, combinations of these, or the like. The encapsulant 109 may be placed within the molding cavity prior to the alignment of the top molding portion and the bottom molding portion, or else may be injected into the molding cavity through an injection port.

Once the encapsulant 109 has been placed into the molding cavity such that the encapsulant 109 encapsulates the first carrier substrate 101, the TIVs 107, and the first photonic integrated circuit 105, the encapsulant 109 may be cured in order to harden the encapsulant 109 for optimum protection. While the exact curing process is dependent at least in part on the particular material chosen for the encapsulant 109, in an embodiment in which molding compound is chosen as the encapsulant 109, the curing could occur through a process such as heating the encapsulant 109 to between about 100° C. and about 130° C., such as about 125° C. for about 60 sec to about 3000 sec, such as about 600 sec. Additionally, initiators and/or catalysts may be included within the encapsulant 109 to better control the curing process.

However, as one having ordinary skill in the art will recognize, the curing process described above is merely an exemplary process and is not meant to limit the current embodiments. Other curing processes, such as irradiation or even allowing the encapsulant 109 to harden at ambient temperature, may be used. Any suitable curing process may be used, and all such processes are fully intended to be included within the scope of the embodiments discussed herein.

Figure 2:
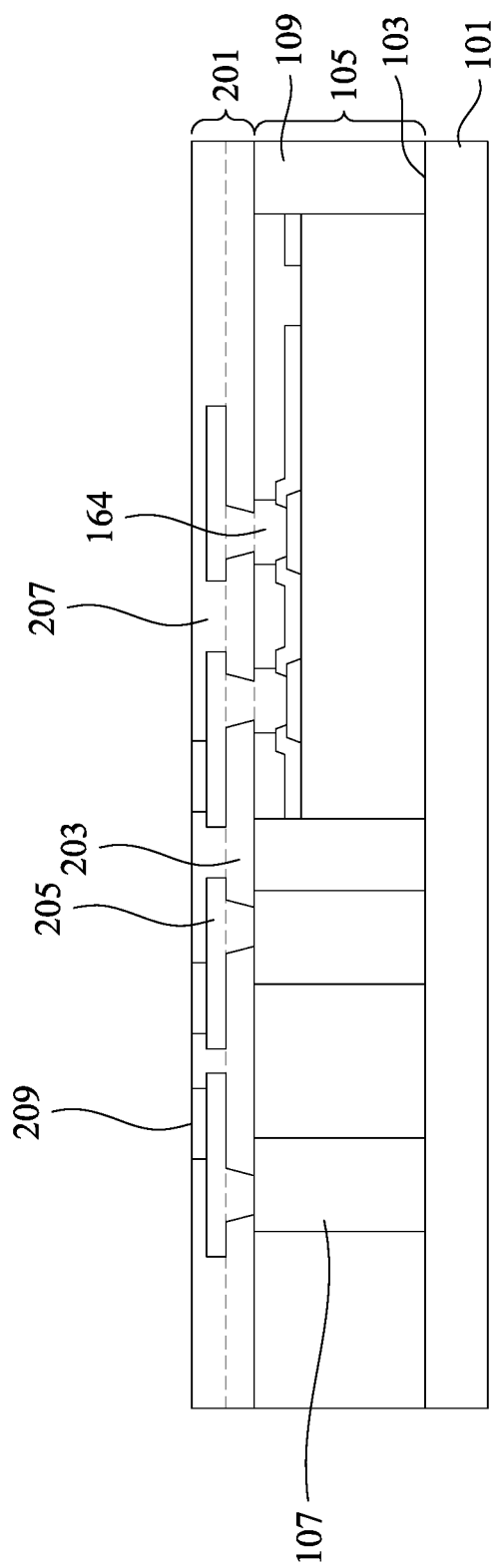
FIG. 2 illustrates a formation of a first redistribution structure, in accordance with some embodiments.

FIG. 2 illustrates a thinning of the encapsulant 109 in order to expose the TIVs 107 and the external contacts 164 of the first photonic integrated circuit 105 for further processing. The thinning may be performed, e.g., using a mechanical grinding or chemical mechanical polishing (CMP) process whereby chemical etchants and abrasives are utilized to react and grind away the encapsulant 109 and the fill material 173 until the TIVs 107 and the external contacts 164 of the first photonic integrated circuit 105 have been exposed. As such, the first photonic integrated circuit 105 and the TIVs 107 may have a planar surface that is also coplanar with the encapsulant 109.

However, while the CMP process described above is presented as one illustrative embodiment, it is not intended to be limiting to the embodiments. Any other suitable removal process may be used to thin the encapsulant 109 and the fill material 173 and expose the TIVs 107. For example, a series of chemical etches may be utilized. This process and any other suitable process may be utilized to thin the encapsulant 109 and the fill material 173, and all such processes are fully intended to be included within the scope of the embodiments.

FIG. 2 additionally illustrates a formation of a first redistribution structure 201 with a first redistribution layer 205 extending through a first dielectric layer 203. In an embodiment the first dielectric layer 203 may be a polymer based dielectric material such as polybenzoxazole (PBO), although any suitable material, such as polyimide or a polyimide derivative, may be utilized. The first dielectric layer 203 may be placed using, e.g., a spin-coating process to a thickness of between about 5 µm and about 25 µm, such as about 7 µm, although any suitable method and thickness may be used.

Once the first dielectric layer 203 has been placed, the first dielectric layer 203 may be patterned in order to expose conductive portions of the underlying structures (e.g., the TIVs 107 and the external contacts 164). In an embodiment the first dielectric layer 203 may be patterned using, e.g., a photolithographic masking and etching process, whereby a photoresist is placed, exposed, and developed, and the photoresist is then used as a mask during an anisotropic etching process. However, any suitable process for patterning the first dielectric layer 203 may be utilized.

Once the first dielectric layer 203 has been patterned, the first redistribution layer 205 may be formed to make contact with the underlying conductive regions. In an embodiment the first redistribution layer 205 may be formed by initially forming a second seed layer of a titanium copper alloy through a suitable formation process such as CVD or sputtering. Once the second seed layer has been deposited, a photoresist (not separately illustrated) may be placed onto the second seed layer to prepare for a formation of the first redistribution structure 201. Once the photoresist has been formed and patterned, a conductive material, such as copper, may be formed on the second seed layer through a deposition process such as plating. The conductive material may be formed to have a thickness of between about 1 µm and about 10 µm, such as about 5 µm. However, while the material and methods discussed are suitable to form the conductive material, these materials are merely exemplary. Any other suitable materials, such as AlCu or Au, and any other suitable processes of formation, such as CVD or PVD, may be used to form the first redistribution layer 205.

Once the conductive material has been formed, the photoresist may be removed through a suitable removal process such as ashing, wet etching, or plasma etching. Additionally, after the removal of the photoresist, those portions of the second seed layer that were covered by the photoresist may be removed through, for example, a suitable etch process using the conductive material as a mask.

Once the first redistribution layer 205 has been formed, a second dielectric layer 207 is formed over the first redistribution layer 205. In an embodiment the second dielectric layer 207 may be similar to the first dielectric layer 203, such as by being a polymer based dielectric formed through spin-coating. However, any suitable material and method of deposition may be utilized.

Once the second dielectric layer 207 has been placed, the second dielectric layer 207 may be patterned in order to expose conductive portions of the underlying structures (e.g., the first redistribution layer 205). In an embodiment the second dielectric layer 207 may be patterned using, e.g., a photolithographic masking and etching process, whereby a photoresist is placed, exposed, and developed, and the photoresist is then used as a mask during an anisotropic etching process. However, any suitable process for patterning the second dielectric layer 207 may be utilized.

In a particular embodiment the first redistribution structure 201 may be formed such that the first redistribution structure 201 has a reduced pitch between conductive elements. For example, the conductive elements may be formed to have a pitch of between about 4 µm and about 20 µm. However, any suitable pitch may be utilized.

Additionally, once the second dielectric layer 207 has been patterned, contact pads 209 may be formed within the openings of the second dielectric layer 207. In an embodiment the contact pads 209 may comprise aluminum, but other materials, such as copper, may be used. The contact pads 209 may be formed using a deposition process, such as sputtering, to form a layer of material (not shown) that fills the openings within the second dielectric layer 207. Once filled, the material may be planarized with the second dielectric layer 207 using, for example, a chemical mechanical polishing process. However, any other suitable process may be utilized to form the contact pads 209.

Figure 3:
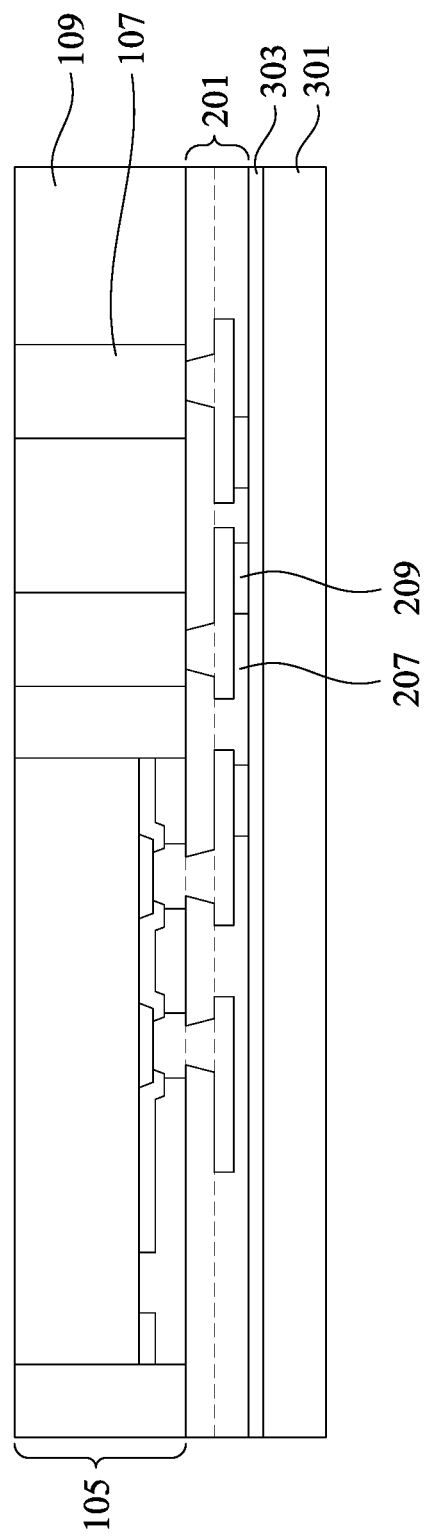
FIG. 3 illustrates a transfer of the structure to a second carrier substrate, in accordance with some embodiments.

FIG. 3 illustrates a transfer of the structure to a second carrier substrate 301 and a removal of the first carrier substrate 101. In an embodiment the second dielectric layer 207 and the contact pads 209 may be attached to the second carrier substrate 301 using, e.g., a second adhesive layer 303. The second carrier substrate 301 and the second adhesive layer 303 may be similar to the first carrier substrate 101 and the first adhesive layer 103 (described above with respect to FIG. 1A), although any suitable structures and any suitable adhesives may be utilized.

Additionally, once the structure has been transferred to the second carrier substrate 301, the first carrier substrate 101 may be removed. In an embodiment the first carrier substrate 101 may be debonded using, e.g., a thermal process to alter the adhesive properties of the first adhesive layer 103. In a particular embodiment an energy source such as an ultraviolet (UV) laser, a carbon dioxide ($CO_2$) laser, or an infrared (IR) laser, is utilized to irradiate and heat the first adhesive layer 103 until the first adhesive layer 103 loses at least some of its adhesive properties. Once performed, the first carrier substrate 101 and the first adhesive layer 103 may be physically separated and removed from the structure.

Once attached to the second carrier substrate 301, the first photonic integrated circuit 105, the encapsulant 109, and the TIVs 107 may be thinned in order to reduce the overall height of the structure. In an embodiment the thinning may be performed using, e.g., a chemical mechanical polishing process. However, any suitable thinning process, such as mechanical grinding or etching processes, may be utilized.

Figure 4:
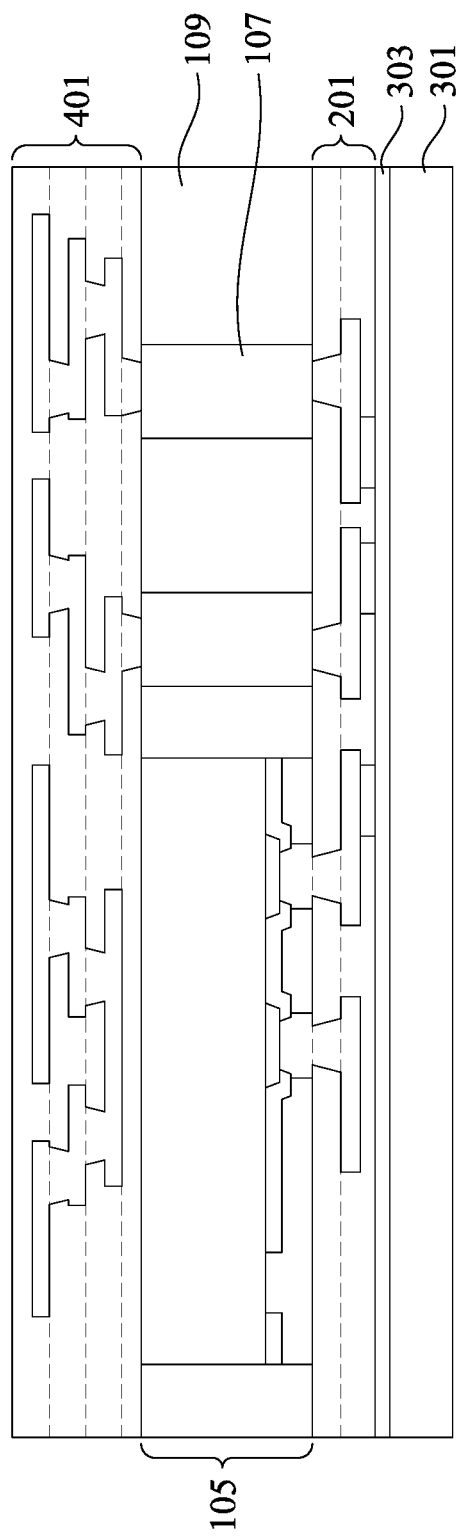
FIG. 4 illustrates a formation of a second redistribution structure, in accordance with some embodiments.

FIG. 4 illustrates that, once the structure has been thinned, a second redistribution structure 401 may be formed on an opposite side of the first photonic integrated circuit 105 from the first redistribution structure 201 and formed in electrical connection with the TIVs 107. In an embodiment the second redistribution structure 401 may be formed using a series of alternating redistribution layers and dielectric layers. Each of the dielectric layers may be a similar material formed using similar processes as the first dielectric layer 203 (described above with respect to FIG. 2) while each of the redistribution layers may be a similar material formed using similar processes as the first redistribution layer 205 (also described above with respect to FIG. 2). However, any suitable materials and methods of manufacture may be utilized.

In an embodiment the second redistribution structure 401 may comprise three redistribution layers and four dielectric layers. However, this number is intended to be illustrative and is not intended to limiting to the embodiments. Rather, any suitable number of redistribution layers and dielectric layers may be utilized, and all such layers are fully intended to be included within the scope of the embodiments.

Additionally, in a particular embodiment the second redistribution structure 401 may be formed such that the second redistribution structure 401 has a reduced pitch between conductive elements. For example, the conductive elements may be formed to have a pitch of between about 4 µm and about 20 µm. However, any suitable pitch may be utilized.

Figure 5:
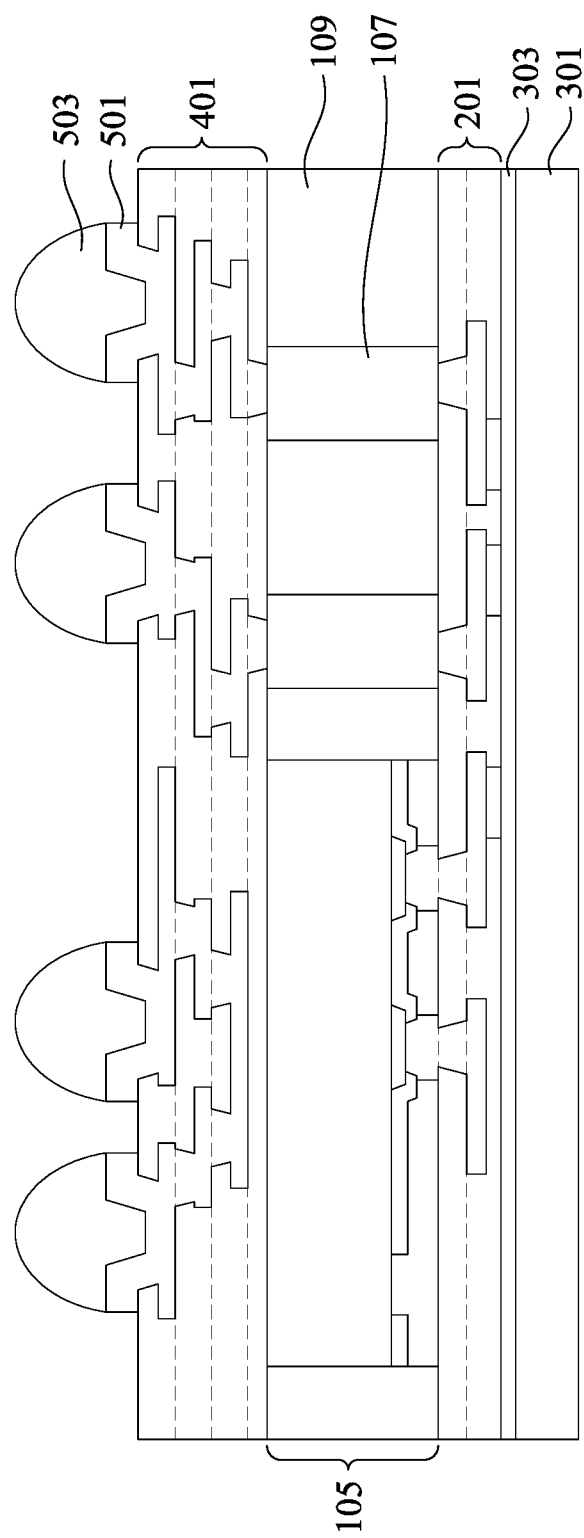
FIG. 5 illustrates a formation of external contacts, in accordance with some embodiments.

FIG. 5 illustrates a formation of underbump metallizations (UBM) 501 in connection with the second redistribution structure 401. In an embodiment the formation of the UBMs 501 may be initiated by first exposing one of the redistribution layers in the second redistribution structure 401 using, e.g., a photolithographic masking and etching process. However, any suitable patterning process may be utilized.

Once exposed, the UBMs 501 may be formed. In an embodiment the UBMs 501 may comprise three layers of conductive materials, such as a layer of titanium, a layer of copper, and a layer of nickel. However, one of ordinary skill in the art will recognize that there are many suitable arrangements of materials and layers, such as an arrangement of chrome/chrome-copper alloy/copper/gold, an arrangement of titanium/titanium tungsten/copper, or an arrangement of copper/nickel/gold, that are suitable for the formation of the UBMs 501. Any suitable materials or layers of material that may be used for the UBMs 501 are fully intended to be included within the scope of the embodiments.

In an embodiment the UBMs 501 are created by forming each layer over the second redistribution structure 401. The forming of each layer may be performed using a plating process, such as electrochemical plating, although other processes of formation, such as sputtering, evaporation, or PECVD process, may also be used depending upon the desired materials. The UBMs 501 may be formed to have a thickness of between about 0.7 µm and about 10 µm, such as about 5 µm.

FIG. 5 additionally illustrates the formation of first external contacts 503 on the UBMs 501. In an embodiment the first external contacts 503 may be, for example, contact bumps as part of a ball grid array (BGA), although any suitable connection may be utilized. In an embodiment in which the first external contacts 503 are contact bumps, the first external contacts 503 may comprise a material such as tin, or other suitable materials, such as silver, lead-free tin, or copper. In an embodiment in which the first external contacts 503 are tin solder bumps, the first external contacts 503 may be formed by initially forming a layer of tin through such methods such as evaporation, electroplating, printing, solder transfer, ball placement, etc, to a thickness of, e.g., about 250 µm. Once a layer of tin has been formed on the structure, a reflow may be performed in order to shape the material into the desired bump shape.

Figure 6:
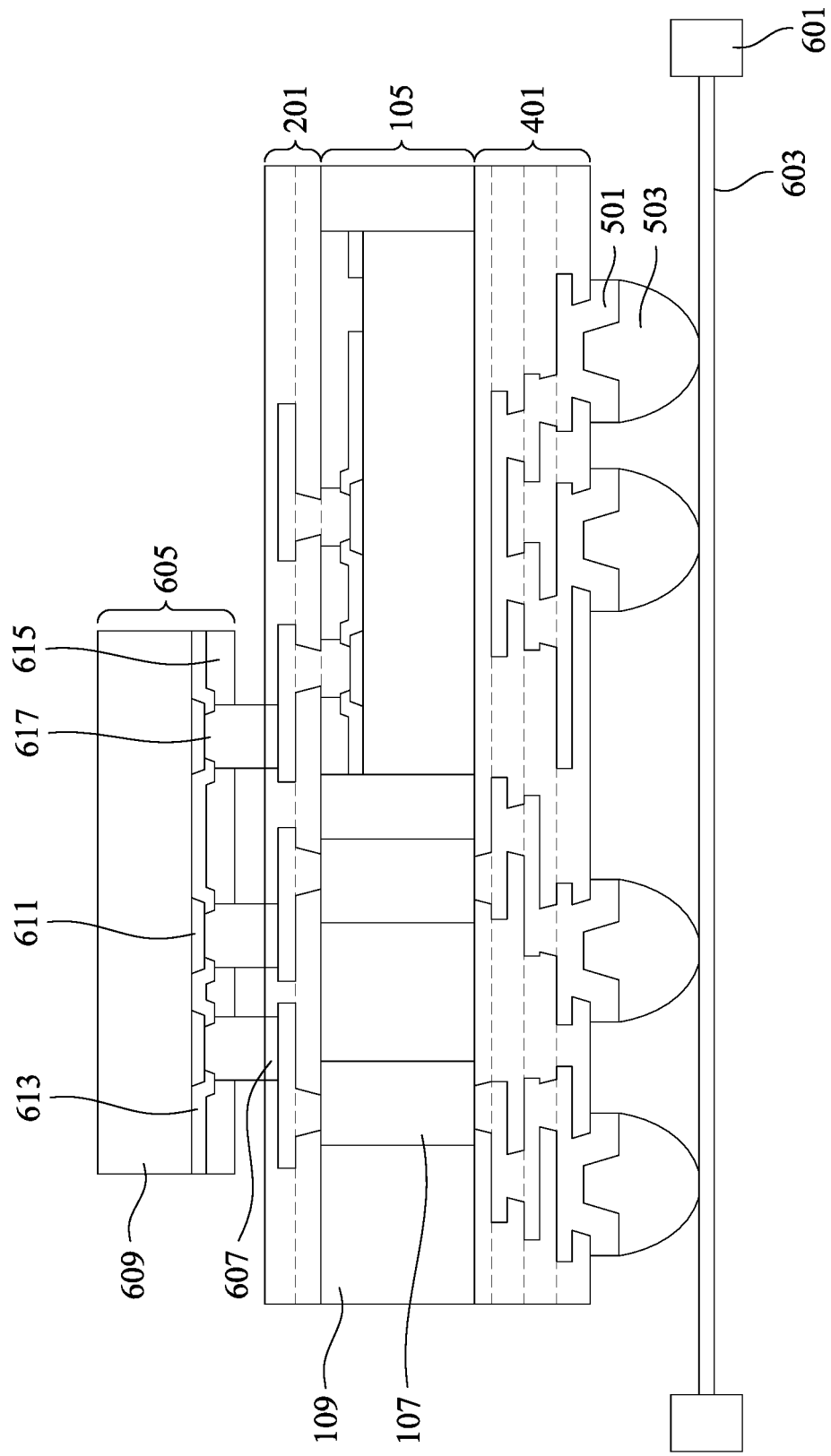
FIG. 6 illustrates a bonding of an electronic integrated circuit, in accordance with some embodiments.

FIG. 6 illustrates that, once the first external contacts 503 have been formed, the first external contacts 503 may be attached to a ring structure 601. The ring structure 601 may be a metal ring intended to provide support and stability for the structure during and after a debonding process. In an embodiment the first external contacts 503 are attached to the ring structure using, e.g., a ultraviolet tape 603, although any other suitable adhesive or attachment may alternatively be used.

Once the first external contacts 503 and are attached to the ring structure 601, the second carrier substrate 301 may be debonded from the structure using, e.g., a thermal process to alter the adhesive properties of the second adhesive layer 303. In a particular embodiment an energy source such as an ultraviolet (UV) laser, a carbon dioxide ($CO_2$) laser, or an infrared (IR) laser, is utilized to irradiate and heat the second adhesive layer 303 until the second adhesive layer 303 loses at least some of its adhesive properties. Once performed, the second carrier substrate 301 and the second adhesive layer 303 may be physically separated and removed.

FIG. 6 additionally illustrates the placement of second external connectors 607 in connection with the first redistribution structure 201. In an embodiment the second external connectors 607 may be contact bumps such as microbumps or controlled collapse chip connection (C4) bumps and may comprise a material such as tin, or other suitable materials, such as solder on past, silver, or copper. In an embodiment in which the second external connectors 607 are tin solder bumps, the second external connectors 607 may be formed by initially forming a layer of tin through any suitable method such as evaporation, electroplating, printing, solder transfer, ball placement, etc, to a thickness of, e.g., about 100 µm. Once a layer of tin has been formed on the structure, a reflow is performed in order to shape the material into the desired bump shape.

Once the second external connectors 607 have been formed, a first electronic integrated circuit (EIC) 605 may be placed into contact with the second external connectors 607 and in electrical contact with the first photonic integrated circuit 105. In an embodiment the first electronic integrated circuit 605 may be comprise devices formed at a surface of an EIC substrate 609 (such as a silicon substrate), that are utilized to interface the first photonic integrated circuit 105 with other devices. For example, the first electronic integrated circuit 605 may comprise controllers, CMOS drivers, transimpedance amplifiers, and the like in order to perform functions such as controlling high-frequency signaling of the first photonic integrated circuit 105 according to electrical signals (digital or analog) received from, e.g., separate logic dies.

In an embodiment the first electronic integrated circuit 605 may further comprise EIC contact pads 611, an EIC passivation layer 613, a EIC protection layer 615, and EIC external contact 617. In an embodiment the EIC contact pads 611, the EIC passivation layer 613, the EIC protection layer 615, and the EIC external contact 617 may be similar to the contact pads 162, the passivation film 163, the protection layer 165, and the external contacts 164, described above with respect to FIG. 1A. However, any suitable structures may be utilized.

The first electronic integrated circuit 605 may be placed onto the second external connectors 607 using, e.g., a pick and place process. However, any other method of placing the first electronic integrated circuit 605 may be used. Once in physical contact, a bonding process may be performed in order to bond the first electronic integrated circuit 605 with the second external connectors 607. For example, in an embodiment in which the second external connectors 607 are solder bumps, the bonding process may comprise a reflow process whereby the temperature of the second external connectors 607 is raised to a point where the second external connectors 607 will liquefy and flow, thereby bonding the first electronic integrated circuit 605 to the second external connectors 607 once the second external connectors 607 resolidifies.

Figure 7:
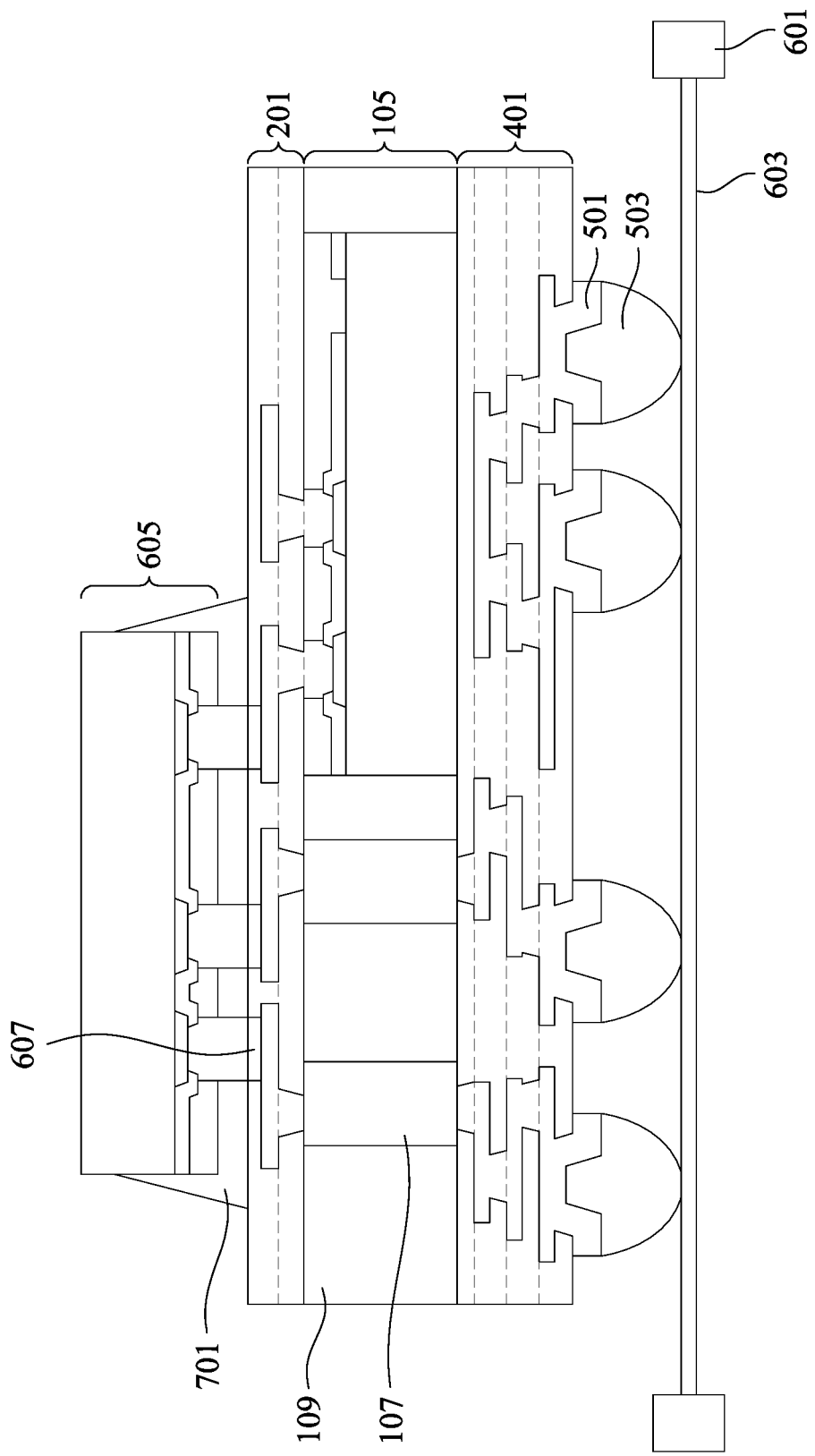
FIG. 7 illustrates a placement of a first underfill, in accordance with some embodiments.

FIG. 7 illustrates a placement of a first underfill 701 between the first electronic integrated circuit 605 and the first redistribution structure 201. In an embodiment the first underfill 701 is a protective material used to cushion and support the first electronic integrated circuit 605 and the first redistribution structure 201 from operational and environmental degradation, such as stresses caused by the generation of heat during operation. The first underfill 701 may be injected or otherwise formed in the space between the first electronic integrated circuit 605 and the first redistribution structure 201 and may, for example, comprise a liquid epoxy that is dispensed between the first electronic integrated circuit 605 and the first redistribution structure 201 and then cured to harden.

Figure 8:
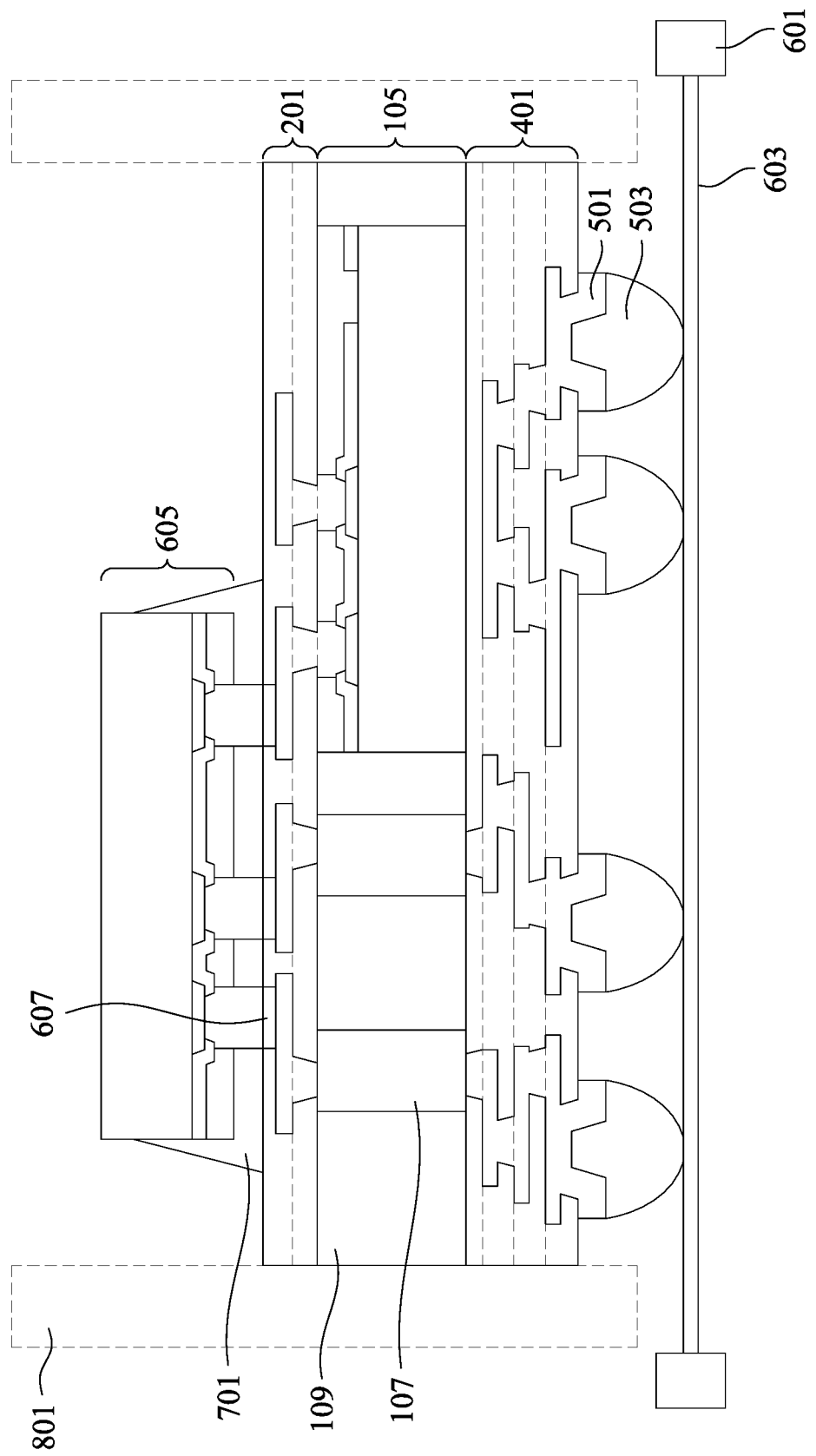
FIG. 8 illustrates a singulation process, in accordance with some embodiments.

FIG. 8 illustrates a singulation process used to singulate the structure. In an embodiment the singulation may be performed by using a saw blade (represented in FIG. 8 by the dashed boxes labeled 801) to slice through the first underfill 701 and the encapsulant 109. However, as one of ordinary skill in the art will recognize, utilizing a saw blade for the singulation is merely one illustrative embodiment and is not intended to be limiting. Any method for performing the singulation, such as utilizing one or more etches, may be utilized. These methods and any other suitable methods may be utilized to singulate the structure.

Figure 9:
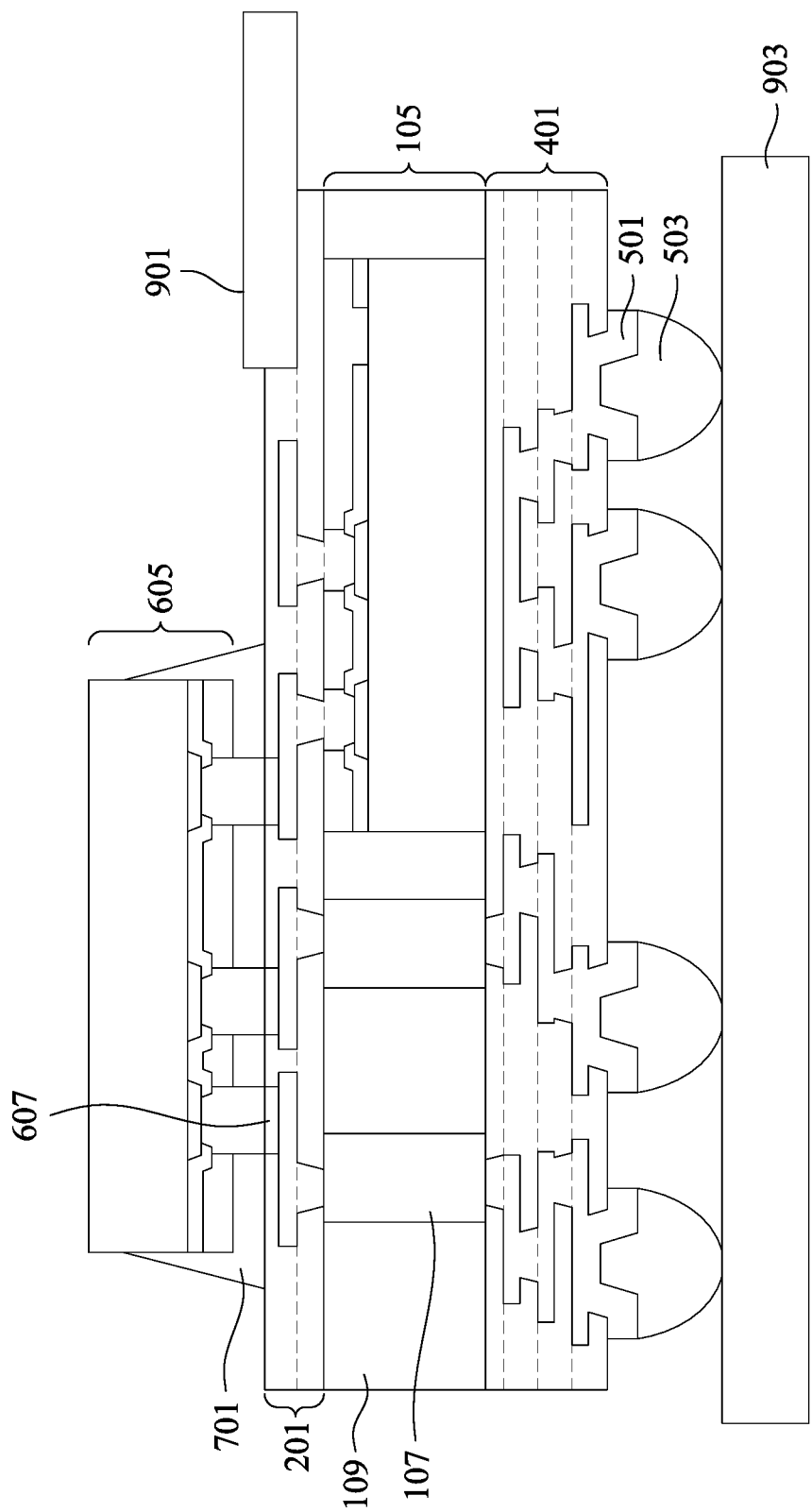
FIG. 9 illustrates a placement of an optical fiber, in accordance with some embodiments.

FIG. 9 illustrates an attachment of an optical fiber 901 which is utilized as an optical input/output port to the first photonic integrated circuit 105. In an embodiment the optical fiber 901 is placed so as to optically couple the optical fiber 901 and the grating coupler 157, such as by positioning the optical fiber 901 so that optical signals leaving the optical fiber 901 is directed through the fill material 173 and hits the grating coupler 157. Similarly, the optical fiber 901 is positioned so that optical signals leaving the grating coupler 157 is directed into the optical fiber 901 for transmission. In a particular embodiment the optical fiber 901 is positioned so that the optical fiber is located on an opposite side of the fill material 173 and the first redistribution structure 201 from the grating coupler 157. However, any suitable location may be utilized If desired, a trench may be formed within the first redistribution structure 201 to assist in the placement of the optical fiber 901. In an embodiment the trench may be formed within the second redistribution structure at any point during the manufacturing process using, for example, a photolithographic masking and etching process. However, any suitable method or combination of methods may be utilized.

FIG. 9 further illustrates an optional bonding of the first external contacts 503 to another substrate 903. In an embodiment the substrate 903 may be a printed circuit board such as a laminate substrate formed as a stack of multiple thin layers (or laminates) of a polymer material such as bismaleimide triazine (BT), FR-4, ABF, or the like. However, any other suitable substrate, such as a silicon interposer, a silicon substrate, organic substrate, a ceramic substrate, or the like, may alternatively be utilized, and all such redistributive substrates that provide support and connectivity to the first external contacts 503 are fully intended to be included within the scope of the embodiments.

By utilizing the fill material 173 to fill the opening 171, an additional layer of protection is provided to the optical path between the optical fiber 901 and the grating coupler 157. In particular, with the presence of the fill material 173 during processes such as the planarization process (described above with respect to FIG. 2), debris from the process is prevented from entering the opening 171 and interfering with the passage of the optical signals. Further, sensitive structures such as the grating couplers 157 are further protected from such processes through the presence of the fill material 173, thereby preventing undesired defects from occurring and increasing the overall yield of the manufacturing process.

Further, by packaging the first integrated photonic circuit 105 as described the first photonic integrated circuit 105 can be modularized in a stand alone package that can achieve good die to die bandwidths by reducing the pitches of the redistribution structures, the TIVs 107, and the external contacts 164. As such, the stand alone package can be quickly installed as desired with other packages or even co-packaged with other packages. As such, the first photonic integrated circuit 105 may be used and incorporated in a wide variety of uses with a minimum or re-design.

Figure 10A:
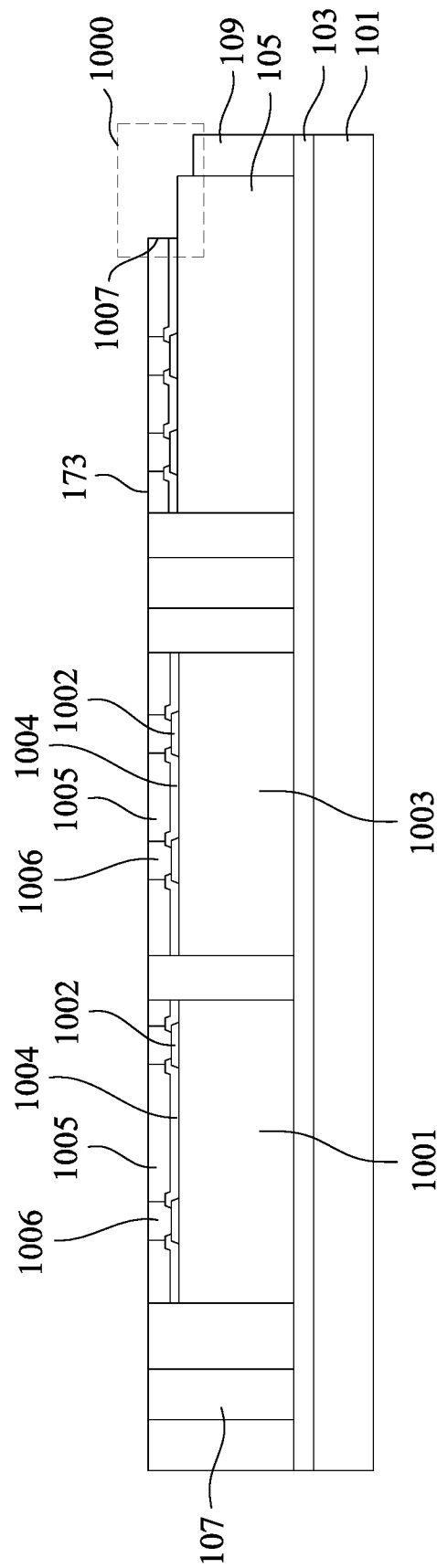
FIGS. 10A-10B illustrates an encapsulation of the first photonic integrated circuit with semiconductor dies, in accordance with some embodiments.
Figure 10B:
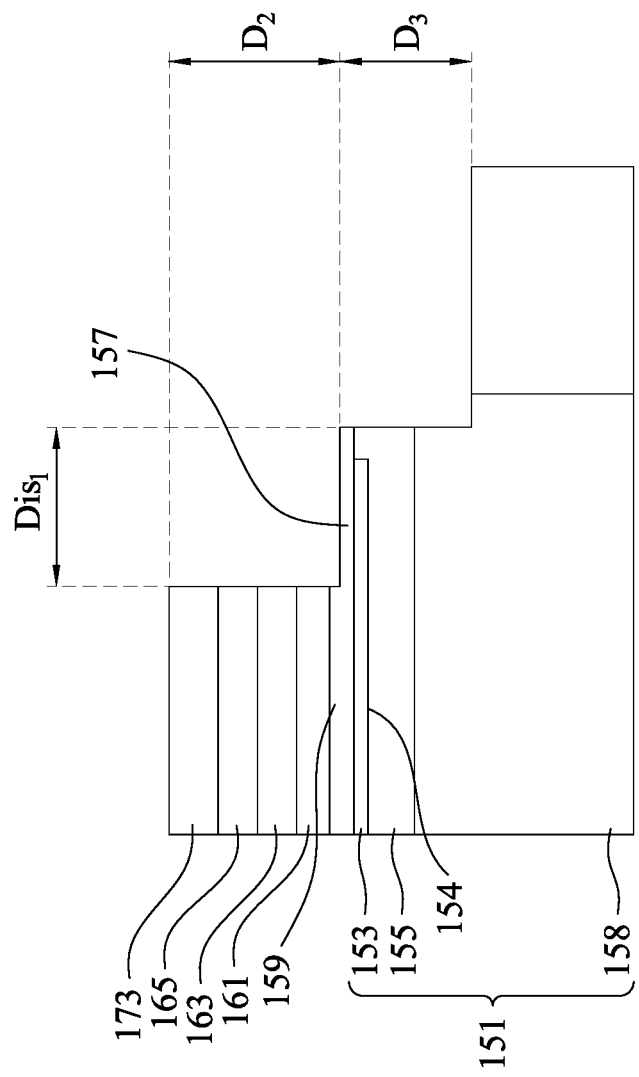

FIGS. 10A-10B illustrate another embodiment in which the first photonic integrated circuit 105, instead of receiving and/or transmitting light to an optical fiber 901 located over the top surface, instead receives and/or transmits light to an optical fiber 901 located along a side of the first photonic integrated circuit 105 (see FIG. 16), with FIG. 10B illustrating a close-up view with more detail of the dashed box labeled 1000 in FIG. 10A. In this embodiment, the TIVs 107 are formed over the first carrier substrate 101 and the first photonic integrated circuit 105 is placed onto the first carrier substrate 101 as described above with respect to FIG. 1A. For example, the TIVs 107 may be formed using a photoresist patterning and plating process, and the first photonic integrated circuit 105 is placed using a pick-and-place process. However, any suitable method of formation or placement may be utilized.

Additionally, in this embodiment the first photonic integrated circuit 105 may be formed without the opening 171. As such, the fill material 173 is formed over the substrate 152, but does not extend into the structure. Additionally, without the removal of the materials for the opening 171 (e.g., the materials of the fill material 173, the protection layer 165, the passivation film 163, the redistribution structure 161, and the dielectric layer 159), the material remains present to protect the underlying structures during subsequent processing such as chemical mechanical polishing.

Additionally in this embodiment, the waveguide 154 is modified in order to accept optical signals from a subsequently formed second waveguide 1101. In particular, in this embodiment the material of the waveguide 154 (e.g., silicon) is formed using, for example, using a photolithographic masking and etching process and is formed as a tapered waveguide in order to accept optical signals that are received at an angle instead of being received perpendicular to the waveguide 154. However, any suitable method of forming the waveguide 154 to accept these signals may be utilized.

FIG. 10A additionally illustrates the placement of a first semiconductor die 1001 and a second semiconductor die 1003 onto the first carrier substrate 101 along with the first photonic integrated circuit 105. In an embodiment the first semiconductor die 1001 and the second semiconductor die 1003 are designed to work cooperatively with the first electronic integrated circuit 605 and the first photonic integrated circuit 105 to perform a desired function, and may be, for example, logic dies, memory dies, ASIC dies, or the like.

For example, in embodiments in which one or more of the first semiconductor die 1001 and the second semiconductor die 1003 are logic devices, the first semiconductor die 1001 and the second semiconductor die 1003 may be devices such as central processing units (CPU), graphics processing unit (GPU), system-on-a-chip (SoC) devices, application processor (AP) devices, microcontrollers, or the like. Additionally, in embodiments in which one or more of the first semiconductor die 1001 and the second semiconductor die 1003 are memory devices, the first semiconductor die 1001 and the second semiconductor die 1003 may be, e.g., a dynamic random access memory (DRAM) die, static random access memory (SRAM) die, hybrid memory cube (HMC) device, high bandwidth memory (HBM) device, or the like. However, any suitable functionalities, defined by any suitable structures, are fully intended to be included within the scope of the embodiments.

In an embodiment both of the first semiconductor die 1001 and the second semiconductor die 1003 may further comprise die contact pads 1002, a die passivation layer 1004, a die protection layer 1005, and die external contacts 1006. In an embodiment the die contact pads 1002, the die passivation layer 1004, the die protection layer 1005, and the die external contacts 1006 may be similar to the contact pads 162, the passivation film 163, the protection layer 165, and the external contact 164, described above with respect to FIG. 1A. However, any suitable structures may be utilized.

FIG. 10A also illustrates an encapsulation of the TIVs 107, the first photonic integrated circuit 105, the first semiconductor die 1001, and the second semiconductor die 1003. In an embodiment the encapsulation may be performed as described above with respect to FIGS. 1A and 2. For example, the encapsulant 109 is placed around the TIVs 107, the first photonic integrated circuit 105, the first semiconductor die 1001, and the second semiconductor die 1003, and the encapsulant 109 may be planarized in order to remove excess portions and expose the TIVs 107, the first photonic integrated circuit 105, the first semiconductor die 1001, and the second semiconductor die 1003. However, any suitable materials and methods may be utilized.

FIG. 10A additionally illustrates that, once the encapsulant 109 has been placed and the chemical mechanical polishing process has been performed, a second opening 1007 may be formed as a window extending from a side of the first photonic integrated circuit 105. However, because the planarization process for the encapsulation has already occurred, the chemical mechanical polishing process can no longer damage structures within the second opening 1007 and debris from the planarization process cannot enter into the second opening 1007.

In an embodiment the formation of the second opening 1007 may be performed using a photolithographic masking and etching process. For example, in an embodiment a photoresist is placed over the structure, imaged with a patterned energy source, and developed. Once the photoresist is in place as a mask, one or more etching processes are utilized to etch through the desired materials and form the second opening 1007.

Looking at FIG. 10B, in an embodiment the second opening 1007 is formed to extend into the first photonic integrated circuit 105 to a second depth $D_2$ of between about 13.5 μm and about 17.5 μm. Additionally, the second opening 1007 may be formed to extend inwards from a sidewall of the first photonic integrated circuit 105 to a first distance $Dis_1$ that is sufficient to form the second opening 1007 over the waveguides 154 within the first photonic integrated circuit 105, such as the first distance $Dis_1$ being between about 100 μm and about 2.5 mm. However, any suitable dimensions may be utilized.

Additionally, during the formation of the second opening 1007, a portion of the encapsulant 109 may be removed and recessed from the first photonic integrated circuit 105. In an embodiment the encapsulant 109 may be recessed a third distance $D_3$ of between about 5 μm and about 20 μm below the surface of the second opening 1007. However, any suitable dimension may be used.

Figure 11A:
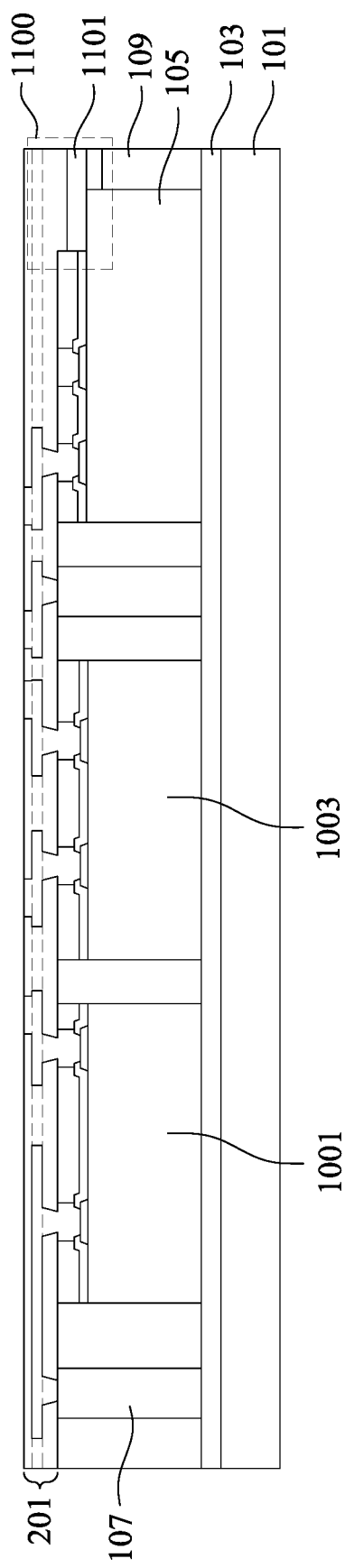
FIG. 11A-11B illustrates formation of a second waveguide, in accordance with some embodiments.
Figure 11B:
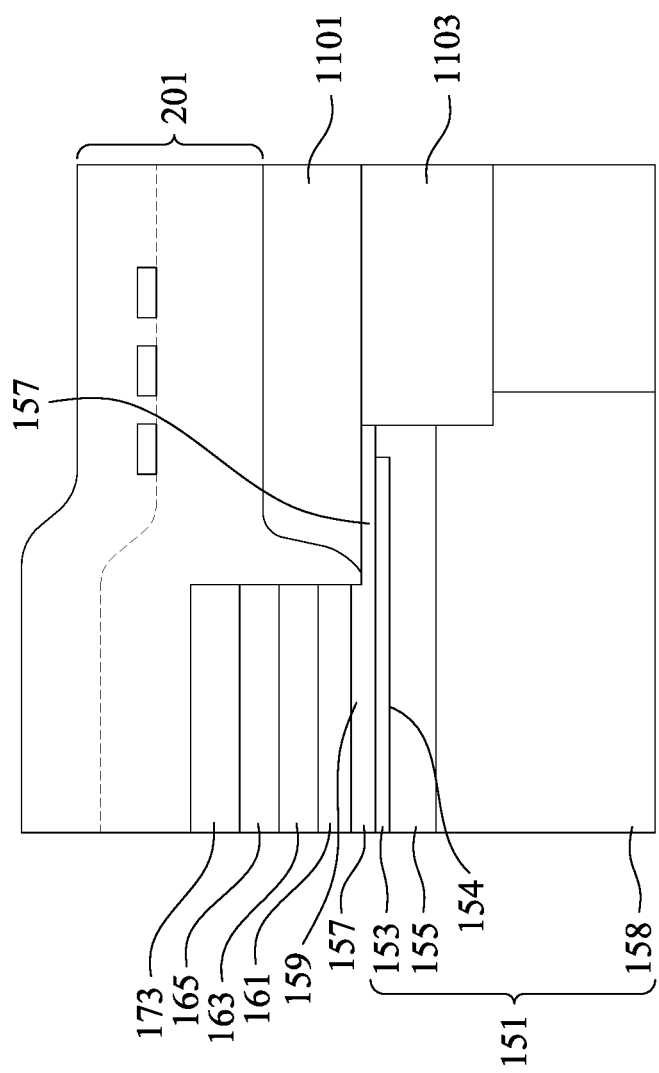

FIGS. 11A-11B illustrate formation of a second waveguide 1101 within the second opening 1007, with FIG. 11B illustrating a close up and more detailed view of the dashed box labeled 1100 in FIG. 11A. In an embodiment the second waveguide 1101 is utilized in order to guide optical signals from the optical fiber 901 (illustrated in this embodiment in FIG. 16 below) to the waveguides 154 already within the first photonic integrated circuit 105. By using the second waveguide 1101 which is formed after the encapsulation process, the waveguides 154 remain protected and less likely to suffer defects during the manufacturing process.

To initiate the formation of the second waveguide 1101, the recessing of the encapsulant 109 is filled with a dielectric fill material 1103. In an embodiment the dielectric fill material 1103 may be a material such as polybenzoxazole (PBO), although any suitable material, such as polyimide or a polyimide derivative, may be utilized. The first dielectric layer 203 may be placed using, e.g., a spin-coating process to fill the second opening 1007. Once in place, the dielectric fill material 1103 may be recessed using, e.g., a wet or dry etching process.

Once the dielectric fill material 1103 is in place, the second waveguide 1101 is formed. In an embodiment the second waveguide 1101 may be any type of waveguide, such as a planar waveguide or a channel waveguide, and may comprise two different materials, a core material and a cladding material, in which the core material has a refractive index higher than the cladding material.

In an embodiment the second waveguide 1101 may be a polymer waveguide and the core material and the cladding material comprise a combination of polymer materials, such as poly(methylmethacrylate) (PMMA), polystyrene (PS), polycarbonate, polyurethane, benzocyclo butane, perfluorovinyl ether cyclopolymer, tetrafluoroethylene, perfluorovinyl ether copolymer, silicone, fluorinated poly(arylene ether sulfide, poly(pentafluoro styrene), fluorinated dendrimers, fluorinated hyperbranched polymers, or the like. In another embodiment, the core material and the cladding material may comprise deuterated and halogenrate polyacrylates, fluorinated polyimides, perfluorocyclobutyl aryl ether polymers, nonlinear optical polymers, or the like. In yet another embodiment, the core material and the cladding material may comprise silicon or silicon dioxide, to utilize the index of refraction between the materials to confine and constrain the path of the optical signals through the second waveguide 1101.

The core material and the cladding material of the second waveguide 1101 may be formed, e.g., by initially placing each layer or combination of layers within the second opening 1007 using a process such as spin coating, doctor blading, extrusion, lamination, or the like. As each layer is formed, the layer may be patterned and shaped in order to control and direct the optical signals to and from the waveguide 154 located further within the first photonic integrated circuit 105. For example, as each layer of material of the second waveguide 1101 is formed, a series of one or more etches such as wet etches or dry etches, may be used to shape the layers of material as desired. However any suitable methods may be utilized.

FIGS. 11A-11B additionally illustrates that, once the second waveguide 1101 has been formed, the first redistribution structure 201 may be formed over the encapsulant 109 and the first photonic integrated circuit 105. In an embodiment the first redistribution structure 201 may be formed as described above with respect to FIG. 2, such as by placing and patterning dielectric layers, and then forming conductive lines over and through the dielectric layers. However, any suitable materials and methods may be utilized.

However, because this embodiment utilizes a second waveguide 1101 which allows for a connection of the optical fiber 901 from a side of the first photonic integrated circuit 105, the conductive layers of the first redistribution structure 201 may additionally be formed over the waveguide 154 and the second waveguide 1101. As such, a larger area for manufacture may be achieved.

Figure 12:
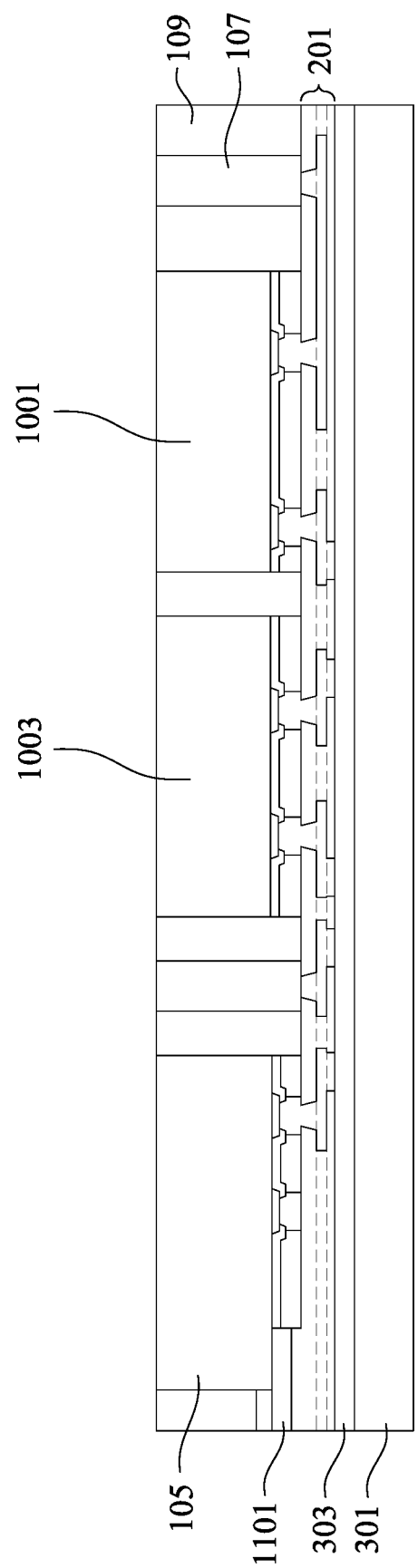
FIG. 12 illustrates attachment of the structure to a second carrier substrate, in accordance with some embodiments.

FIG. 12 illustrates a transfer of the structure to the second carrier substrate 301 using the second adhesive layer 303. In an embodiment the transfer may be performed as described above with respect to FIG. 3, such as by attaching the first redistribution structure 201 to the second adhesive layer 303, removing the first carrier substrate 101, and then thinning the encapsulant, the TIVs 107, the first photonic integrated circuit 105, the first semiconductor die 1001, and the second semiconductor die 1003. However, any suitable methods may be utilized.

Figure 13:
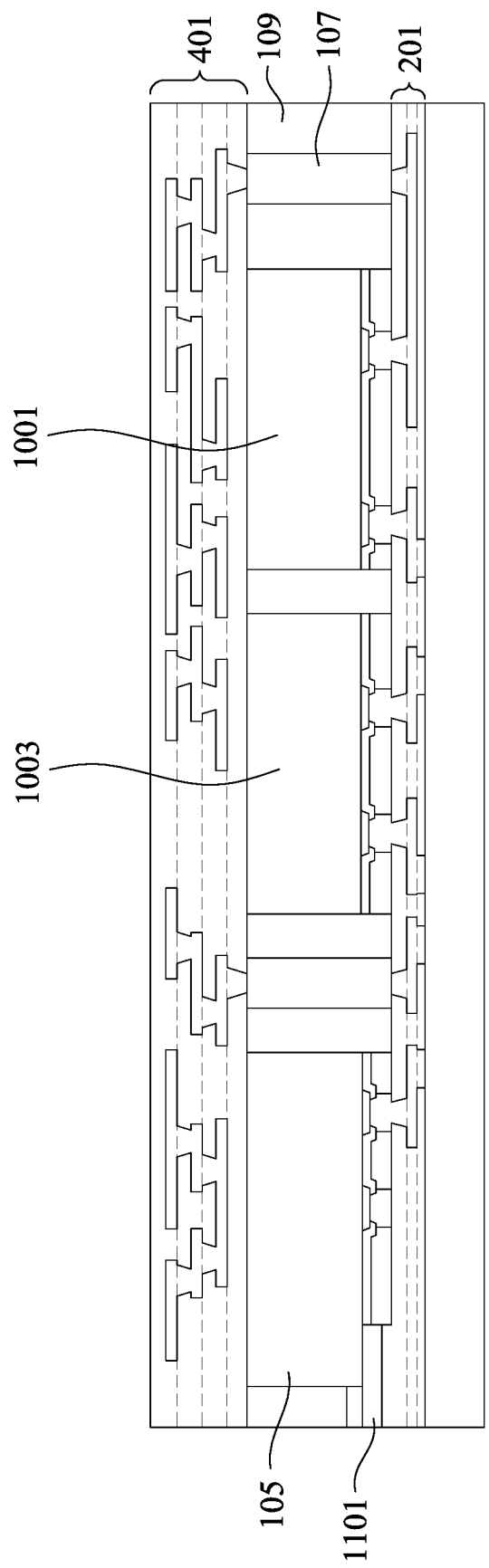
FIG. 13 illustrates formation of a second redistribution structure, in accordance with some embodiments.

FIG. 13 illustrates a formation of the second redistribution structure 401 in electrical connection with the TIVs 107. In an embodiment the second redistribution structure 401 may be formed as described above with respect to FIG. 4, such as by placing and patterning dielectric layers, and then forming conductive lines over and through the dielectric layers, and repeating this process as often as desired. However, any suitable materials and methods may be utilized.

Figure 14:
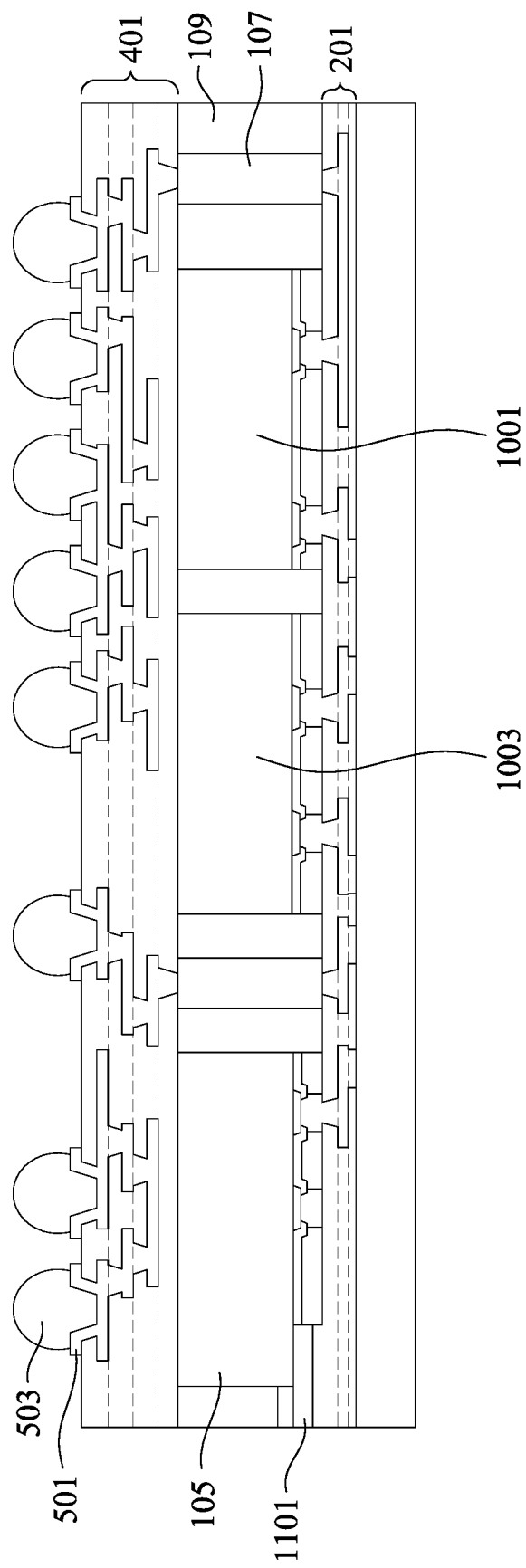
FIG. 14 illustrates formation of external contacts, in accordance with some embodiments.

FIG. 14 illustrates formation of the UBMs 501 and formation of the first external contacts 503. In an embodiment the UBMs 501 and the first external contacts 503 may be formed as described above with respect to FIG. 5. For example, the UBMs 501 may be formed through one of the dielectric layers of the second redistribution structure 401, the first external contacts 503 are formed and/or placed over the UBMs 501, and a reflow process may be performed. However, any suitable methods and materials may be utilized.

Figure 15:
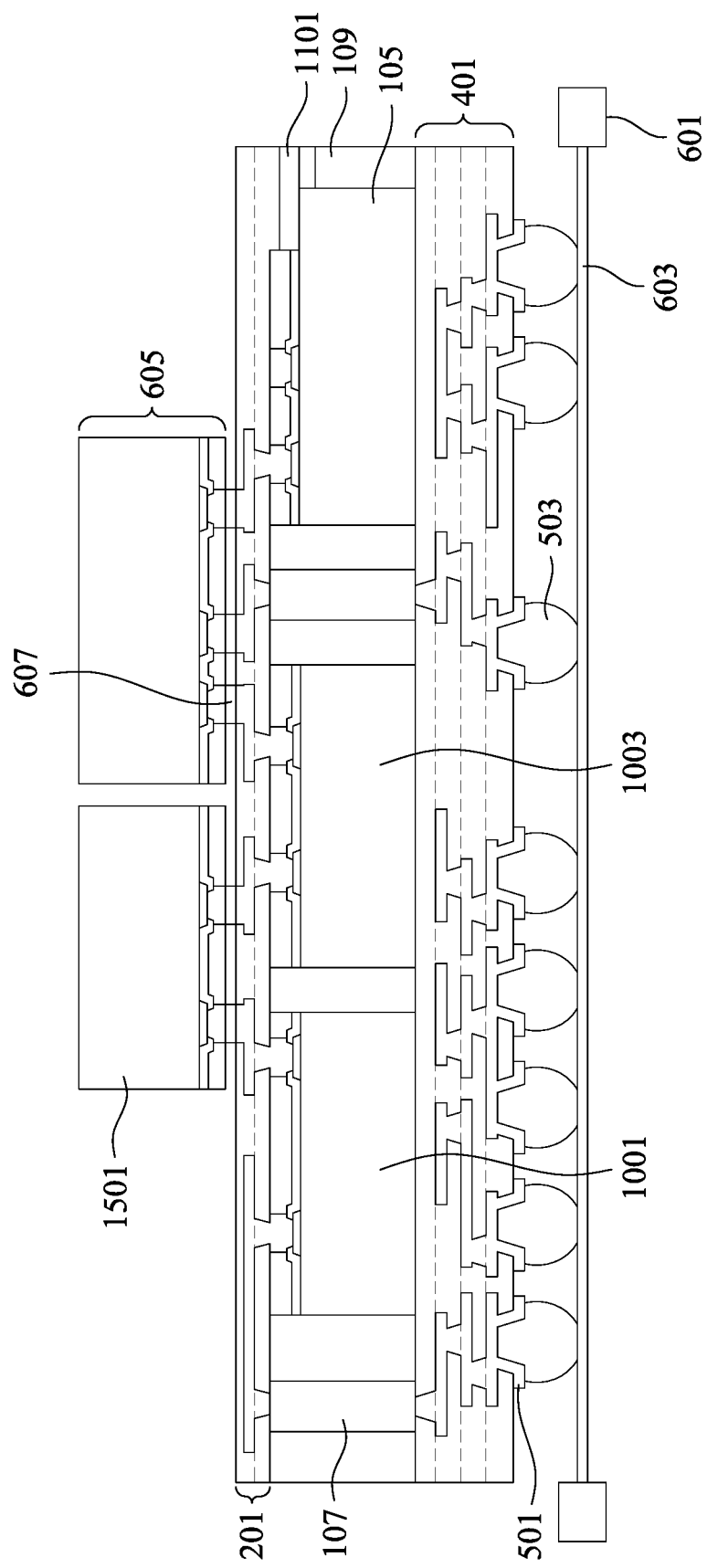
FIG. 15 illustrates bonding of the electronic integrated circuit, in accordance with some embodiments.

FIG. 15 illustrates a placement of the structure on the ring structure 601, a removal of the second carrier substrate 301, a placement of the second external connectors 607, and the placement of the first electronic integrated circuit 605 using, e.g., a pick and place process.

FIG. 15 additionally illustrates the placement of a third semiconductor die 1501. In an embodiment the third semiconductor die 1501 may be similar to the first semiconductor die 1001 and/or the second semiconductor die 1003 (e.g., may be a logic die, a memory die, or the like) and may be placed in a similar fashion (e.g., through a pick and place process). However, any suitable functionality and any suitable method of placement may be utilized.

Figure 16:
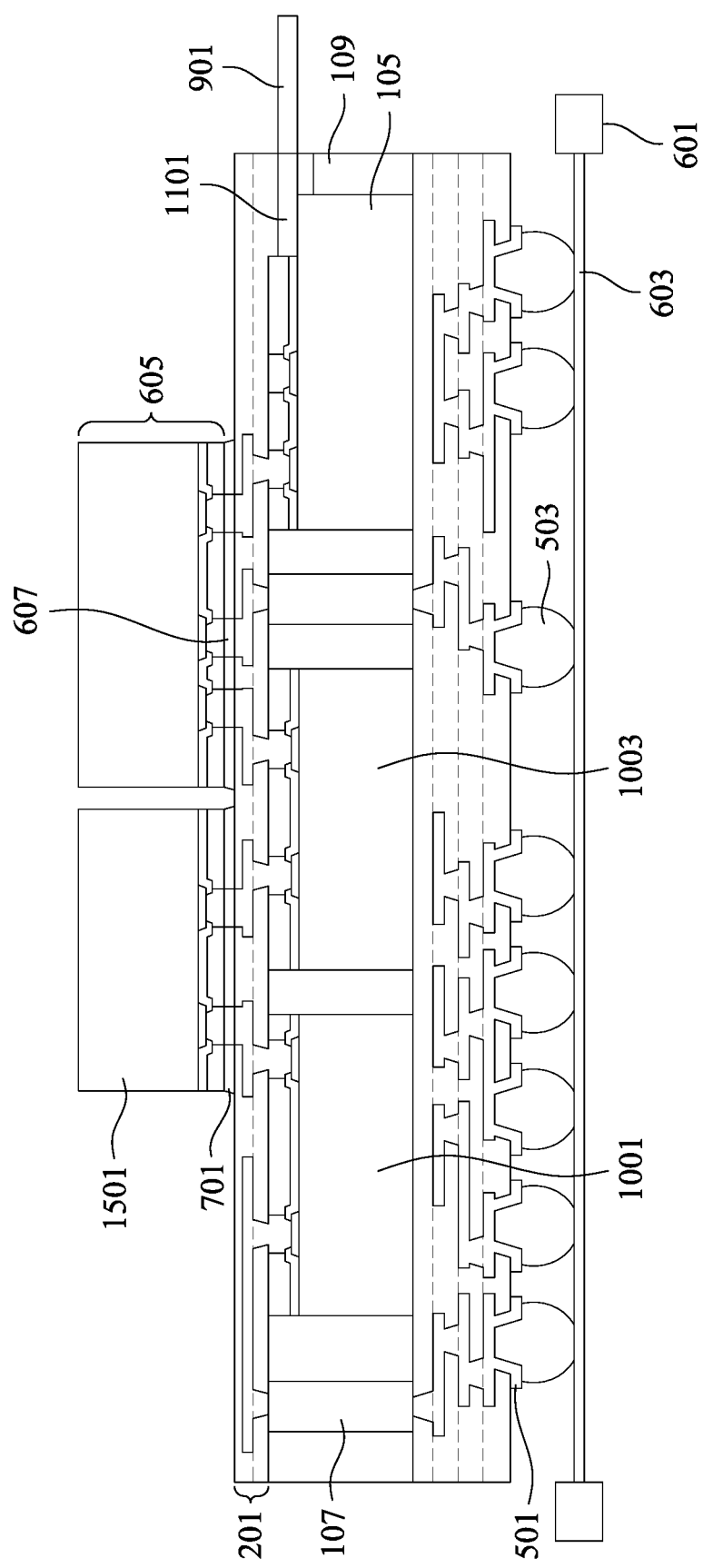
FIG. 16 illustrates placement of the optical fiber, in accordance with some embodiments.

FIG. 16 illustrates a bonding of the first electronic integrated circuit 605 and the third semiconductor die 1501 to the first redistribution structure 201. In an embodiment the bonding may be performed as described above with respect to FIG. 7, such as by performing a reflow process. However, any suitable method of bonding may be utilized.

FIG. 16 additionally illustrates a placement of the first underfill 701 between the first redistribution structure 201 and the first electronic integrated circuit 605 and the third semiconductor die 1501, and a singulation of the structure such that the second waveguide 1101 is planar with the encapsulant 109 and the first redistribution structure 201. In an embodiment the placement of the first underfill 701 and the singulation process may be performed as described above with respect to FIGS. 7 and 8. However, any suitable methods and materials may be utilized.

Finally, FIG. 16 illustrates a placement of the optical fiber 901 in optical connection with the second waveguide 1101. In an embodiment the optical fiber 901 routes optical signals into the second waveguide 1101, which receives the optical signals and guides them into the first photonic integrated circuit 105 and towards the waveguide 154. By using the second waveguide 1101, the waveguide 154 can remain protected and fewer defects can occur during the manufacturing process.

Figure 17:
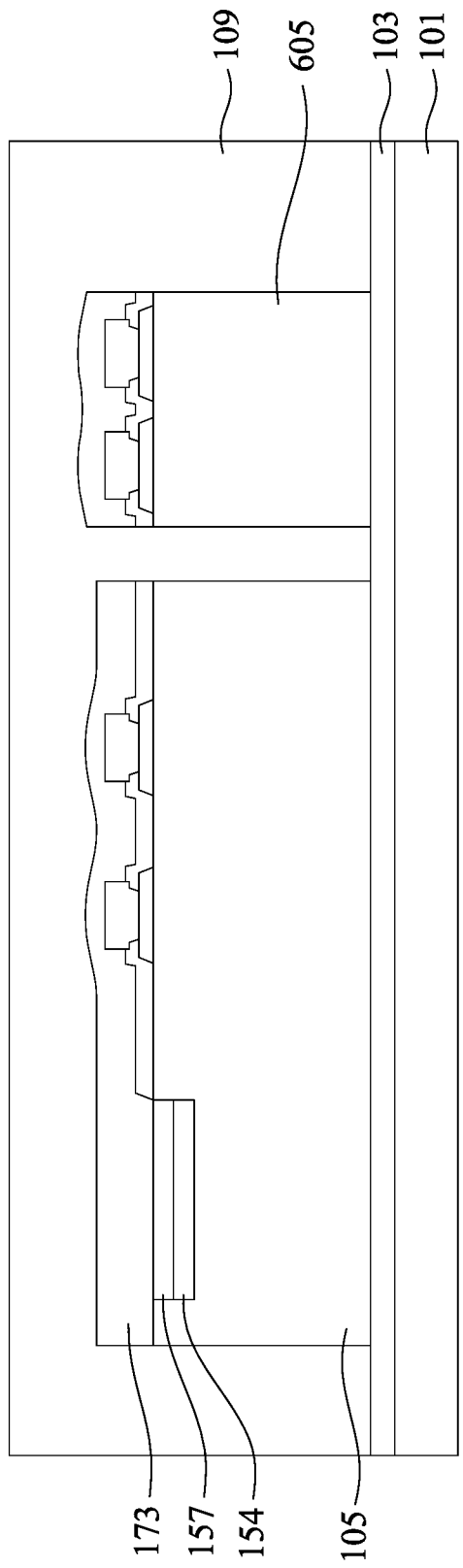
FIG. 17 illustrates an encapsulation of the first photonic integrated circuit with the electronic integrated circuit, in accordance with some embodiments.

FIG. 17 illustrates yet another embodiment in which the structures of the first photonic integrated circuit 105 (as described above with respect to FIGS. 1A-1B) are protected using the fill material and the formation of the second waveguide 1101. In this embodiment, however, the first electronic integrated circuit 605 is embedded within the encapsulant 109 along with the first photonic integrated circuit 105. In this embodiment the TIVs 107 are not formed over the first carrier substrate 101, and both the first photonic integrated circuit 105 and the first electronic integrated circuit 605 are formed, singulated, and placed on to the first carrier substrate 101 and the first adhesive layer 103 using, e.g., a pick and place process.

Additionally, FIG. 17 also illustrates placement of the encapsulant 109 around the first photonic integrated circuit 105 and the first electronic integrated circuit 605. In an embodiment the encapsulant 109 may be placed as described above with respect to FIG. 1A. However, any suitable material and method may be utilized to encapsulate the first photonic integrated circuit 105 and the first electronic integrated circuit 605.

Figure 18:
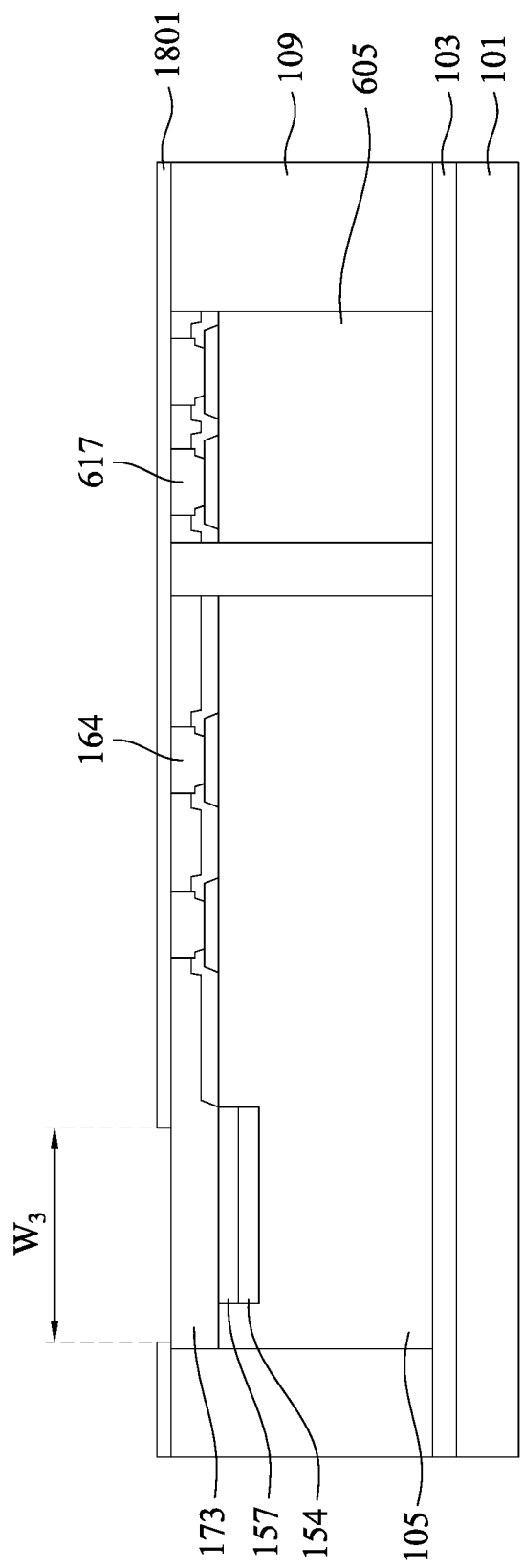
FIG. 18 illustrates a first hard mask, in accordance with some embodiments.

FIG. 18 illustrates a planarization process to remove excess material of the encapsulant 109 and the fill material 173 and to expose the external contacts 164 of the first photonic integrated circuit 105 and the EIC external contact 617 of the first electronic integrated circuit 605. In an embodiment the planarization process may be a chemical mechanical polishing process, although any suitable planarization process, such as mechanical grinding or even a series of one or more etching processes, may be utilized.

FIG. 18 also illustrates a deposition and patterning of a first hard mask layer 1801 over the encapsulant 109, the first photonic integrated circuit 105 and the first electronic integrated circuit 605. In an embodiment the first hard mask layer 1801 may be a material such as titanium, tantalum, combinations of these, or the like, using a deposition process such as chemical vapor deposition, physical vapor deposition, atomic layer deposition, combinations of these, or the like. However, any suitable materials and methods of deposition may be utilized.

Once the first hard mask layer 1801 has been deposited, the first hard mask layer 1801 may be patterned in order to expose a portion of the fill material 173 over the grating coupler 157 for removal. In an embodiment the first hard mask layer 1801 may be patterned using a photolithographic masking and etching process in order to form opening 171 (as shown in FIG. 1B) over the grating coupler 157. However, any suitable method may be used to pattern the first hard mask layer 1801.

In an embodiment the first hard mask layer 1801 may be patterned to have an opening with a third width $W_3$ that is sufficient for the subsequent removal of the underlying fill material 173 as well as formation of the second waveguide 1101 (not illustrated in FIG. 18 but illustrated and described below with respect to FIG. 21). As such, in some embodiments the third width $W_3$ may be between about 100 μm and about 2.5 mm, although any suitable dimensions may be utilized.

Figure 19:
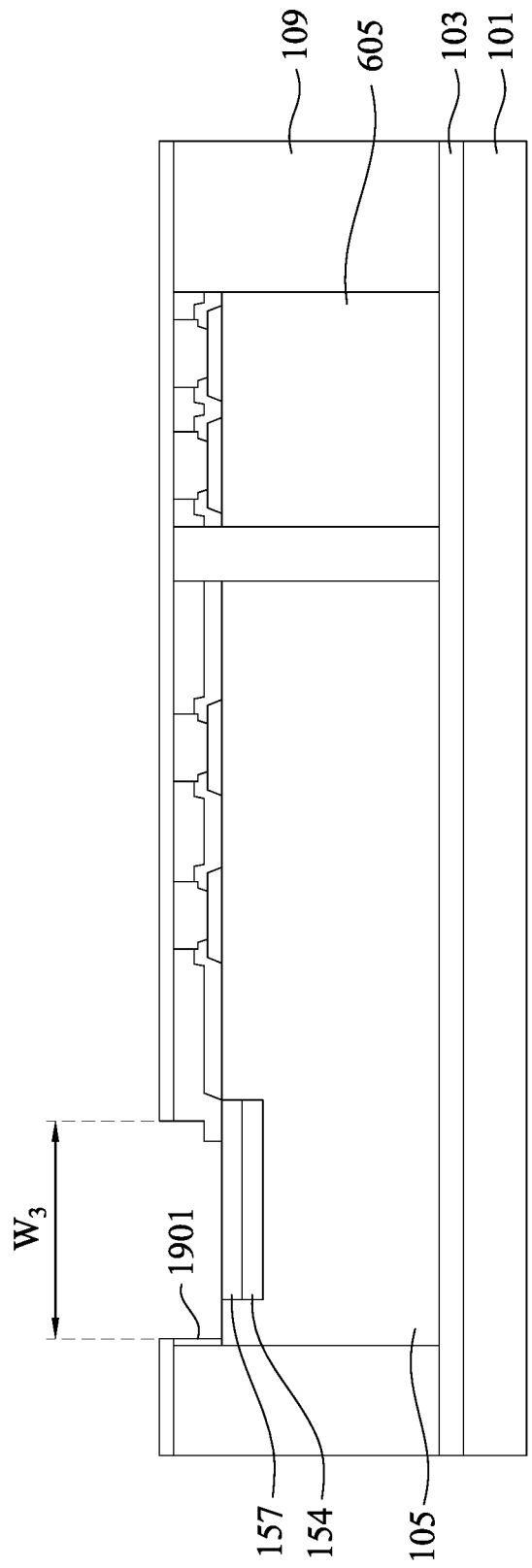
FIG. 19 illustrates formation of an opening, in accordance with some embodiments.

FIG. 19 illustrates that, once the first hard mask layer 1801 has patterned, that portion of the fill material 173 that is exposed may be removed to expose the grating coupler 157 and the waveguide 154 and form a third opening 1901. In an embodiment the removal may be performed using an ashing process in the presence of oxygen. In such a process, the temperature of the fill material 173 is increased until the exposed portions, in contact with the oxygen ambient, undergo a decomposition process and are removed. However, any suitable process, such as an anisotropic etching process, may be used to remove the exposed portions of the fill material 173 and expose the grating coupler 157. In an embodiment the third opening 1901 may be formed with the third width $W_3$ and a third depth $D_3$ of between about 13.5 μm and about 31 μm. However, any suitable dimensions may be utilized.

Figure 20:
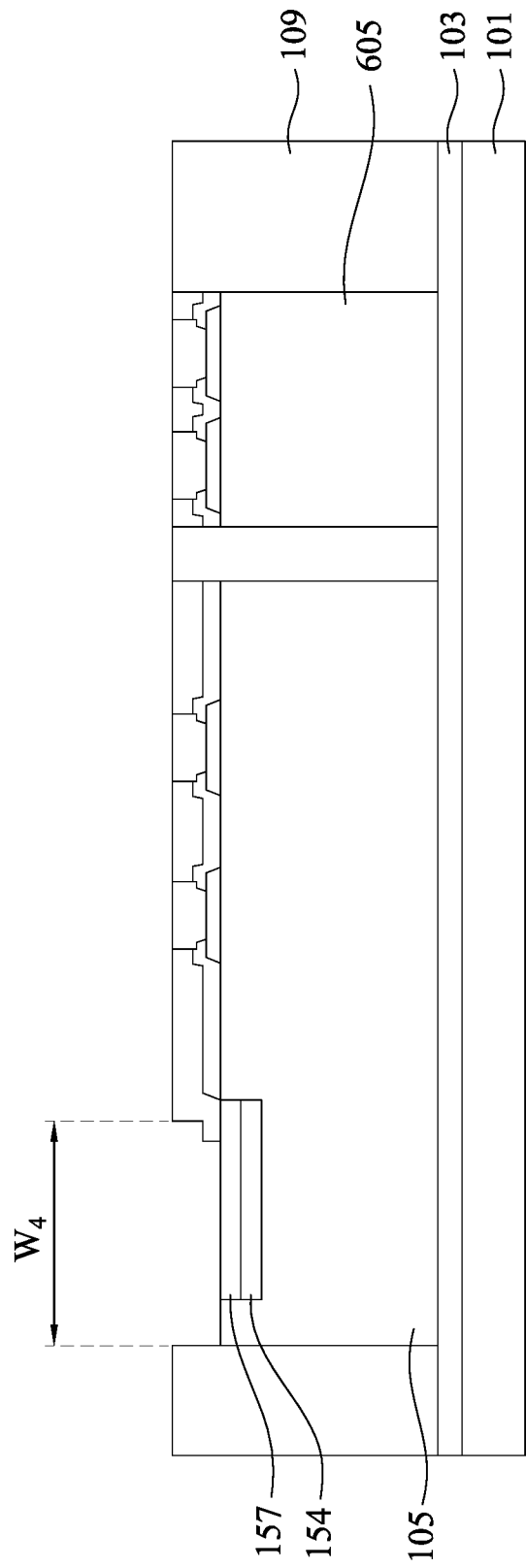
FIG. 20 illustrates a thinning process, in accordance with some embodiments.

FIG. 20 illustrates an optional trimming process that may be utilized in order to recess the fill material 173 away from the grating coupler 157. In an embodiment the first hard mask layer 1801 may be removed using, e.g., a wet or dry etching process. However, any suitable process may be used to remove the first hard mask layer 1801.

Once the first hard mask layer 1801 has been removed, a separate photolithographic masking and etching process may be utilized in order to recess the material of the fill material 173. By recessing the material, the third opening 1901 may be extended to have a fourth width $W_4$ of between about 100 μm and about 2.5 mm. However, any suitable dimension may be utilized.

Figure 21:
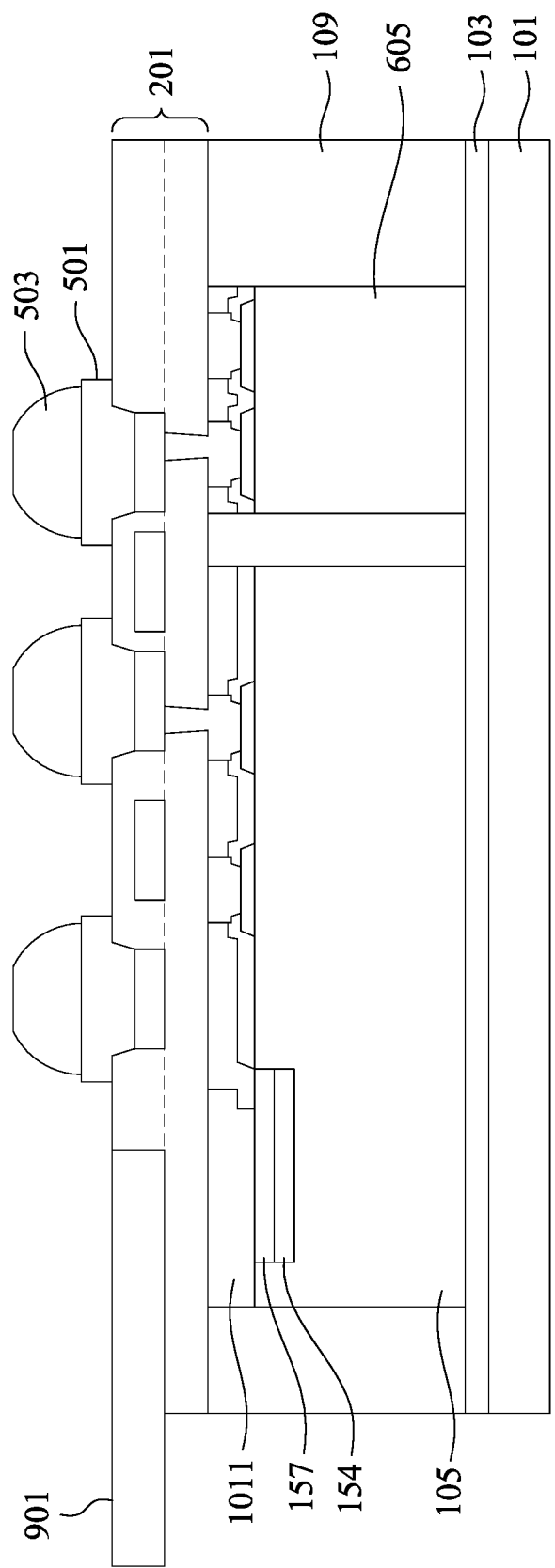
FIG. 21 illustrates formation of a second waveguide and first redistribution structure, in accordance with some embodiments.

FIG. 21 illustrates that once the trimming process has been performed, the second waveguide 1101 may be formed within the first photonic integrated circuit 105. In an embodiment the second waveguide 1101 may be formed as described above with respect to FIG. 11. For example, a series of polymer materials are deposited and patterned into the third opening 1901. Once deposited the materials can be planarized. However, any suitable method of forming the second waveguide 1101 may be utilized.

FIG. 21 also illustrates that once the second waveguide 1101 has been formed, the first redistribution structure 201 may be formed in order to interconnect the first photonic integrated circuit 105 and the first electronic integrated circuit 605. In an embodiment the first redistribution structure 201 may be formed as described above with respect to FIG. 2. For example, a series of dielectric and conductive materials are alternatingly deposited and/or patterned to form the first redistribution structure 201. However, any suitable methods and materials may be utilized.

FIG. 21 additionally illustrates a formation of the UBMs 501 and the first external contacts 503. In an embodiment the UBMs 501 and the first external contacts 503 may be formed as described above with respect to FIG. 5. For example, the UBMs 501 may be formed through one of the dielectric layers of the first redistribution structure 201, the first external contacts 503 are formed and/or placed over the UBMs 501, and a reflow process may be performed. However, any suitable methods and materials may be utilized.

Finally, FIG. 21 illustrates a placement of the optical fiber 901 over the second waveguide 1101. In an embodiment the optical fiber 901 may be placed within a trench formed within the first redistribution structure 201 and positioned in order to send and receive optical signals to the second waveguide 1101. However, any suitable placement may be utilized.

By utilizing the fill material 173 to protect the underlying structures during the planarization process of the encapsulant 109, no debris from the planarization process can get embedded and interfere with the subsequent processing or operation of the first photonic integrated circuit 105. Further, the material of the fill material 173 is present to protect the underlying structures during the planarization process, leading to less damage and fewer defects.

Figure 22:
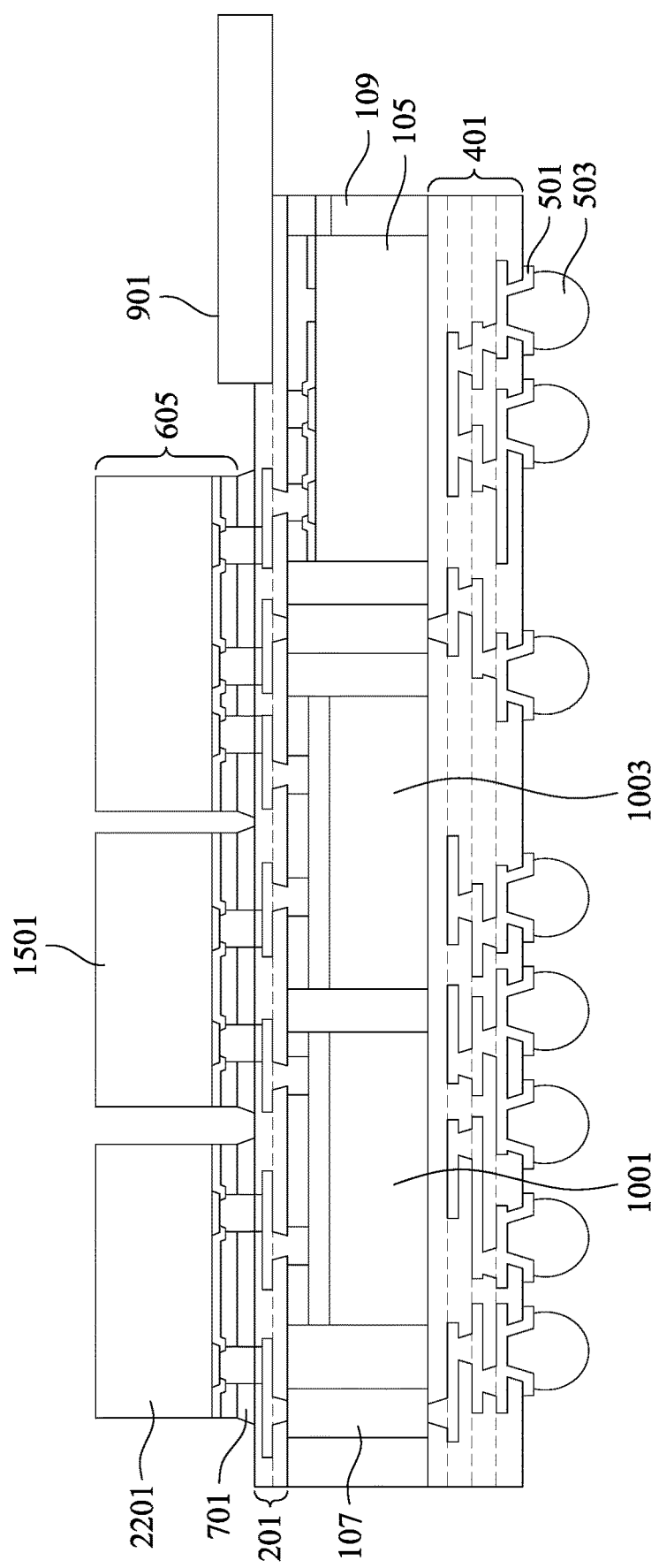
FIG. 22 illustrates a fully integrated device, in accordance with some embodiments.

FIG. 22 illustrates yet another embodiment in which the modularized embodiment illustrated in FIGS. 1A-9 is, instead fully integrated into a device with the first semiconductor die 1001, the second semiconductor die 1003, the third semiconductor die 1501, and a fourth semiconductor device 2201 (which may be similar to the first semiconductor die 1001). In this embodiment the first photonic integrated device 105 as described above with respect to FIGS. 1A-1B is encapsulated with the first semiconductor die 1001 and the second semiconductor die 1003, and then the first photonic integrated circuit 105 is processed as described above with respect to FIG. 1B. Once encapsulated, the first redistribution structure 201 and the second redistribution structure 401 are formed, and the first electronic integrated circuit 605 and the third semiconductor die 1501 are bonded. Additionally, the fourth semiconductor device 2201 is bonded to the first redistribution structure 201 in a similar fashion as the third semiconductor die 1501.

By integrating the first photonic integrated circuit 105 with the first semiconductor die 1001, the second semiconductor die 1003, the third semiconductor die 1501 and the fourth semiconductor device 2201, a fully integrated device with all of the desired functionality co-packaged can be obtained that is easily scalable to any desired bandwidth. In one particular embodiment, the first semiconductor die 1001 and the second semiconductor die 1003 may be both be logic chips (e.g., LSIs), the third semiconductor die 1501 may be an ASIC device, and the fourth semiconductor device 2201 may be a memory device such as a high bandwidth memory. However, any suitable combination of devices may be utilized in order to form a fully incorporated device with the first photonic integrated circuit 105.

By utilizing the embodiments described herein, a cost effective silicon photonic device can be achieved which utilizes homogenous protection layers such as the fill material 173 and/or secondary waveguides (e.g., the second waveguide 1101) without the use of through silicon vias in the first photonic integrated circuit 105. By using these structures, other structures, such as grating couplers 157 or waveguides 154 can remain protected from damage and contamination during certain in-situ manufacturing processes such as chemical mechanical polishing processes. By utilizing this protection, the overall fabrication process including the edge coupler to grating coupler fiber assembly can be eased.

In accordance with an embodiment, a method of manufacturing a semiconductor device includes; removing a portion of a first photonic integrated circuit device to form an opening as an optical pathway to a grating coupler within the first photonic integrated circuit device; filling the opening with a fill material; and forming a first redistribution layer over the fill material. In an embodiment the method further includes: forming a through via on a carrier substrate; placing the first photonic integrated circuit device adjacent to the through via on the carrier substrate; and encapsulating the through via and the first photonic integrated circuit device with an encapsulant, wherein the forming the first redistribution layer forms the first redistribution layer over the fill material. In an embodiment the method further includes, prior to the forming the first redistribution layer, planarizing the fill material, the through via, and the encapsulant. In an embodiment the method further includes forming a second redistribution layer on an opposite side of the first photonic integrated circuit device from the first redistribution layer. In an embodiment the method further includes attaching a first electronic integrated circuit to the first redistribution layer. In an embodiment the fill material comprises polyimide.

In accordance with an embodiment, a semiconductor device includes: a first photonic integrated circuit, the first photonic integrated circuit including: a semiconductor substrate; a waveguide formed within the semiconductor substrate; a grating coupler formed within the semiconductor substrate; a fill material overlying the grating coupler; and external contacts planar with the fill material; and a redistribution layer overlying the fill material and the external contacts. In an embodiment the semiconductor device further includes an encapsulant surrounding the first photonic integrated circuit. In an embodiment the semiconductor device further includes through vias extending from a first side of the encapsulant to a second side of the encapsulant. In an embodiment the semiconductor device further includes an electronic integrated circuit bonded to the redistribution layer. In an embodiment the semiconductor device further includes a first semiconductor die located within the encapsulant. In an embodiment the semiconductor device further includes an electronic integrated circuit bonded to the redistribution layer. In an embodiment the semiconductor device further includes an optical fiber located over the redistribution layer. In an embodiment the fill material is polyimide.

In accordance with yet another embodiment, a semiconductor device includes: a photonic integrated circuit including: a first waveguide over a substrate; and a second waveguide at least partially over the first waveguide; and a redistribution layer overlying the second waveguide, the redistribution layer having a surface that is co-planar with a surface of the second waveguide. In an embodiment, the semiconductor device further includes: an encapsulant encapsulating the photonic integrated circuit; and through vias extending through the encapsulant. In an embodiment the semiconductor device further includes a first semiconductor die within the encapsulant. In an embodiment the semiconductor device further includes a second redistribution layer located on an opposite side of the first semiconductor die than the redistribution layer. In an embodiment the first waveguide is a silicon waveguide and the second waveguide is a polymer waveguide. In an embodiment the semiconductor device further includes: a dielectric material located between the second waveguide and the encapsulant; and an optical fiber located adjacent to the second waveguide.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A method of manufacturing a semiconductor device, the method comprising:
    forming a grating coupler over a substrate of a first photonic integrated circuit device, the grating coupler comprising one or more channels for optical signals;
    after the forming the grating coupler, covering the grating coupler with a dielectric material;
    after the covering the grating coupler, removing a portion of the dielectric material to form an opening as an optical pathway to the grating coupler within the first photonic integrated circuit device;
    filling the opening with a fill material; and
    forming a first redistribution layer over the fill material.

2. The method of claim 1, further comprising:
    forming a through via on a carrier substrate;
    placing the first photonic integrated circuit device adjacent to the through via on the carrier substrate; and
    encapsulating the through via and the first photonic integrated circuit device with an encapsulant, wherein the forming the first redistribution layer forms the first redistribution layer over the fill material.

3. The method of claim 2, further comprising, prior to the forming the first redistribution layer, planarizing the fill material, the through via, and the encapsulant.

4. The method of claim 3, further comprising forming a second redistribution layer on an opposite side of the first photonic integrated circuit device from the first redistribution layer.

5. The method of claim 4, further comprising attaching a first electronic integrated circuit to the first redistribution layer.

6. The method of claim 1, wherein the fill material comprises polyimide.

7. A semiconductor device comprising:
    a first photonic integrated circuit, the first photonic integrated circuit comprising:
        a semiconductor substrate;
        a waveguide formed within the semiconductor substrate, the waveguide comprising semiconductor sidewalls;
        a grating coupler formed within the semiconductor substrate, the grating coupler comprising semiconductor sidewalls;
        a fill material overlying the grating coupler; and
        external contacts with top surfaces planar with top surfaces of the fill material; and
    a redistribution layer overlying the fill material and the external contacts.

8. The semiconductor device of claim 7, further comprising an encapsulant surrounding the first photonic integrated circuit.

9. The semiconductor device of claim 8, further comprising through vias extending from a first side of the encapsulant to a second side of the encapsulant.

10. The semiconductor device of claim 9, further comprising an electronic integrated circuit bonded to the redistribution layer.

11. The semiconductor device of claim 9, further comprising a first semiconductor die located within the encapsulant.

12. The semiconductor device of claim 11, further comprising an electronic integrated circuit bonded to the redistribution layer.

13. The semiconductor device of claim 7, further comprising an optical fiber located over the redistribution layer.

14. The semiconductor device of claim 7, wherein the fill material is polyimide.

15. A semiconductor device comprising:
    a photonic integrated circuit comprising:
        a first waveguide over a substrate; and
        a second waveguide at least partially over the first waveguide;
    an encapsulant encapsulating the photonic integrated circuit, wherein the second waveguide extends at least partially over the encapsulant, wherein the encapsulant comprises a single continuous material throughout the encapsulant;
    a redistribution layer overlying the second waveguide, the redistribution layer having a surface that is co-planar with a surface of the second waveguide.

16. The semiconductor device of claim 15, further comprising through vias extending through the encapsulant.

17. The semiconductor device of claim 16, further comprising a first semiconductor die within the encapsulant.

18. The semiconductor device of claim 17, further comprising a second redistribution layer located on an opposite side of the first semiconductor die than the redistribution layer.

19. The semiconductor device of claim 17, wherein the first waveguide is a silicon waveguide and the second waveguide is a polymer waveguide.

20. The semiconductor device of claim 19, further comprising:
    a dielectric material located between the second waveguide and the encapsulant; and
    an optical fiber located adjacent to the second waveguide.

* * * * *